(12) United States Patent
Kang et al.

(10) Patent No.: US 11,870,570 B2
(45) Date of Patent: Jan. 9, 2024

(54) SIGNAL RECEIVING DEVICE INCLUDING SAMPLER, VOTING CIRCUIT, AND EYE OPEN MONITOR CIRCUIT

(71) Applicant: Samsung Electronics Co., Ltd., Suwon-si (KR)

(72) Inventors: Young San Kang, Yongin-si (KR); Byoung Sul Kim, Suwon-si (KR); Soo-Hyung Kim, Hwaseong-si (KR); Jun-Ho Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

(21) Appl. No.: 17/581,876

(22) Filed: Jan. 22, 2022

(65) Prior Publication Data

US 2022/0399955 A1 Dec. 15, 2022

(30) Foreign Application Priority Data

Jun. 15, 2021 (KR) .................. 10-2021-0077333

(51) Int. Cl.
*H04L 1/00* (2006.01)
*G11C 7/22* (2006.01)
*H04L 1/16* (2023.01)
*G11C 7/14* (2006.01)
*H04L 1/1607* (2023.01)

(52) U.S. Cl.
CPC .............. *H04L 1/0042* (2013.01); *G11C 7/14* (2013.01); *G11C 7/22* (2013.01); *H04L 1/0045* (2013.01); *H04L 1/1678* (2013.01)

(58) Field of Classification Search
CPC ... H04L 1/0042; H04L 1/0045; H04L 1/1678; G11C 7/14; G11C 7/22
See application file for complete search history.

(56) References Cited

U.S. PATENT DOCUMENTS

| | | | |
|---|---|---|---|
| 6,047,112 A * | 4/2000 | Wise ....................... | G06F 13/16 711/E12.003 |
| 7,430,261 B2 * | 9/2008 | Forest ................... | H03M 13/43 375/364 |
| 8,098,724 B2 | 1/2012 | Shumarayev et al. | |
| 8,278,961 B2 | 10/2012 | Watanabe et al. | |

(Continued)

FOREIGN PATENT DOCUMENTS

KR 20120130346 A 11/2012

*Primary Examiner* — Justin R Knapp
(74) *Attorney, Agent, or Firm* — Muir Patent Law, PLLC

(57) ABSTRACT

A signal receiving device includes a sampling device configured to sample an input signal to output a plurality of sampling values, and an output circuit configured to output data based on the sampling values. The output circuit outputs the data by performing majority voting based on first to third sampling values of the sampling values in response to a first control signal, and outputs the data and first and second error count signals based on the first sampling value and fourth and fifth sampling values of the sampling values in response to a second control signal. The first error count signal is generated by comparing the first sampling value sampled under a reference condition with the fourth sampling value sampled under a first offset condition, and the second error count signal is generated by comparing the first sampling value with the fifth sampling value sampled under a second offset condition.

20 Claims, 19 Drawing Sheets

(56) References Cited

U.S. PATENT DOCUMENTS

| | | |
|---|---|---|
| 8,687,738 B1 * | 4/2014 | Lee .................. H04L 7/033 |
| | | 327/147 |
| 8,744,012 B1 | 6/2014 | Ding et al. |
| 8,756,027 B1 | 6/2014 | Sheng |
| 9,184,904 B2 | 11/2015 | Doi |
| 9,252,785 B2 * | 2/2016 | Buchmann ............. H03L 7/00 |
| 10,084,621 B2 * | 9/2018 | Song ................ H04L 7/0025 |
| 10,809,297 B2 | 10/2020 | Lee et al. |
| 2004/0193970 A1 * | 9/2004 | Dietrich ............. H04L 25/06 |
| | | 714/700 |

* cited by examiner

| Byte\Bit | 7 | 6 | 5 | 4 | 3 | 2 | 1 | 0 |
|---|---|---|---|---|---|---|---|---|
| 0 | Operation code (3Bh) | | | | | | | |
| 1 | Reserved | | | Mode = 1Fh | | | | |
| 2 | BUFFER ID | | | | | | | |
| 3 | (MSB) | | | | | | | |
| 4 | BUFFER OFFSET | | | | | | | |
| 5 | | | | | | | | (LSB) |
| 6 | (MSB) | | | | | | | |
| 7 | PARAMETER LIST LENGTH | | | | | | | |
| 8 | | | | | | | | (LSB) |
| 9 | Control = 00h | | | | | | | |

FIG. 10

| MODE | DESCRIPTION |
|---|---|
| 00h | Not used in UFS |
| 01h | Vendor Specific |
| 02h | Data |
| ... | Not used in UFS |
| 0Eh | Download microcode with offsets, save and defer active |
| ... | Not used in UFS |
| 1Dh | Reserved |
| 1Eh | Reserved |
| 1Fh | EYE OPEN MONITOR |

FIG. 12

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | EOM DATA LENGTH (N-11) | | | | | | ⎬ EDH |
| 2 | | | | | | | | (LSB) | |
| 3 | PHASE SELECT ||||||||  |
| 4 | VREF CONTROL |||||||| |
| 5 | NUMBER OF SAMPLING |||||||| |
| 6 | VREF RESOLUTION |||| PHASE RESOLUTION (GEAR) |||| |
| 7 | Reserved = 00h |||||||| |
| 8 | Reserved = 00h |||||||| |
| 9 | Reserved = 00h |||||||| |
| 10 | Reserved = 00h |||||||| |
| 11 | Reserved = 00h |||||||| ⎭ |

| 12 | Data[0] | ⎫ |
|---|---|---|
| ... | ... | ⎬ EDP |
| N | Data[EOM DATA LENGTH - 1] | ⎭ |

FIG. 15

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | Total Data Length (N+1) | | | | | | |
| 2 | | | | | | | | (LSB) | |
| 3 | (MSB) | | | | | | | | |
| 4 | | | EOM Data Pattern Length (N-11) | | | | | | |
| 5 | | | | | | | | (LSB) | ⎬ EDH |
| 6 | | | | Timing Step | | | | | |
| 7 | | | | Voltage Step | | | | | |
| 8 | | | | Number of Sampling | | | | | |
| 9 | | | | Timing Offset | | | | | |
| 10 | | | | Voltage Offset | | | | | |
| 11 | | | | Reserved 1 | | | | | ⎭ |
| 12 | | | | | | | | | ⎫ |
| 13 | | | | | | | | | |
| 14 | | | | | | | | | |
| 15 | | | | | | | | | |
| 16 | | | | | | | | | |
| 17 | | | | | | | | | |
| 18 | | | | EOM Data Pattern | | | | | ⎬ EDP |
| 19 | | | | | | | | | |
| 20 | | | | | | | | | |
| 21 | | | | | | | | | |
| ⋮ | | | | | | | | | |
| N-2 | | | | | | | | | |
| N-1 | | | | | | | | | |
| N | | | | | | | | | ⎭ |

FIG. 16

| Response UPIU | | | |
|---|---|---|---|
| 0 xx10 0001b | 1 Flags | 2 LUN | 3 Task Tag |
| 4 IID \| Command Set Type | 5 Reserved | 6 Response | 7 Status |
| 8 Total EHS Length (00h) | 9 Device Information | 10 Data Segment Length | 11 |
| 12 (MSB) | 13 Residual Transfer Count | 14 | 15 (LSB) |
| 16 | 17 Reserved | 18 | 19 |
| 20 | 21 Reserved | 22 | 23 |
| 24 | 25 Reserved | 26 | 27 |
| 28 | 29 Reserved | 30 | 31 |
| Header E2ECRC (omit if HD=0) | | | |
| k Sense Data Length | k+1 Sense Data Length | k+2 Sense Data[0] | k+3 Sense Data[1] |
| k+4 Sense Data[2] | k+5 Sense Data[3] | k+6 Sense Data[4] | k+7 Sense Data[5] |
| ... | ... | ... | ... |
| k+16 Sense Data[14] | k+17 Sense Data[15] | k+18 Sense Data[16] | k+19 Sense Data[17] |
| Data E2ECRC (omit if DD=0) | | | |

NOTE 1 k = 32 if HD = 0.

SIGNAL RECEIVING DEVICE INCLUDING SAMPLER, VOTING CIRCUIT, AND EYE OPEN MONITOR CIRCUIT

CROSS-REFERENCE TO RELATED APPLICATION(S)

This application claims priority under 35 U.S.C. § 119 to Korean Patent Application No. 10-2021-0077333 filed on Jun. 15, 2021 in the Korean Intellectual Property Office (KIPO), the disclosure of which is incorporated in its entirety by reference herein.

BACKGROUND

1. Technical Field

The present disclosure relates to a signal receiving device.

2. Description of the Related Art

An eye open monitor (EOM) is used to identify quality characteristics of a signal transmitted to and received from the channel. For example, a memory system may improve signal transmission and reception quality between a memory device and a host device by measuring an eye of a signal received in a signal receiving end (e.g., receiver of the memory device). As the EOM is performed at high speed, an operating speed of an electronic device may be improved.

In case of an electronic device mounted on an autonomous vehicle, for example, consistent and reliable signal transmission and reception are required in various driving environments (e.g., high temperature environment and low temperature environment). Therefore, in consideration of this case, it is required to design a signal receiving device.

SUMMARY

An object of the present disclosure is to provide a signal receiving device that enables a high speed EOM operation and reliable signal reception.

The objects of the present disclosure are not limited to those mentioned above and additional objects of the present disclosure, which are not mentioned herein, will be clearly understood by those skilled in the art from the following description of the present disclosure.

According to some aspects of the present disclosure, there is provided a signal receiving device comprises a sampling device configured to sample an input signal to output a plurality of sampling values, and an output circuit configured to output data based on the plurality of sampling values, wherein the output circuit outputs the data by performing majority voting based on first to third sampling values of the plurality of sampling values in response to a first control signal, and outputs the data and first and second error count signals based on the first sampling value and fourth and fifth sampling values of the plurality of sampling values in response to a second control signal, the first error count signal is generated by comparing the first sampling value sampled under a reference condition with the fourth sampling value sampled under a first offset condition, and the second error count signal is generated by comparing the first sampling value with the fifth sampling value sampled under a second offset condition different from the first offset condition.

According to some aspects of the present disclosure, there is provided a signal receiving device comprises a first signal processing device configure to perform a first processing on an input signal to generate a first processed signal, a second signal processing device configured to perform a second processing, which is different from the first processing, on the input signal to generate a second processed signal, a third signal processing device configured to perform a third processing, which is different from the first processing and the second processing, on the input signal to generate a third processed signal, a clock recovery circuit configured to recover a clock signal from the first processed signal to generate a recovered clock signal, a first sampler configured to extract a first sampling value from the first processed signal based on the recovered clock signal and a reference voltage, a second sampler configured to extract a second sampling value from the second processed signal based on a first offset clock signal in which a first horizontal offset is applied to the recovered clock signal and a first offset voltage in which a first vertical offset is applied to the reference voltage, a third sampler configured to extract a third sampling value from the third processed signal based on a second offset clock signal in which a second horizontal offset is applied to the recovered clock signal and a second offset voltage in which a second vertical offset is applied to the reference voltage, and an output circuit configured to output data by performing majority voting based on the first to third sampling values.

According to some aspects of the present disclosure, there is provided a signal receiving device comprises a clock recovery circuit configured to recover a clock signal from an input signal to generate a recovered clock signal, a first sampler configured to extract a first sampling value from the input signal based on the recovered clock signal and a reference voltage, a second sampler configured to extract a second sampling value from the input signal based on a first offset clock signal in which a first horizontal offset is applied to the recovered clock signal and a first offset voltage in which a first vertical offset is applied to the reference voltage, a third sampler configured to extract a third sampling value from the input signal based on a second offset clock signal in which a second horizontal offset is applied to the recovered clock signal and a second offset voltage in which a second vertical offset is applied to the reference voltage, and an output circuit configured to output a first error count signal by comparing the first sampling value with the second sampling value and output a second error count signal by comparing the first sampling value with the third sampling value.

BRIEF DESCRIPTION OF THE DRAWINGS

The above and other aspects and features of the present disclosure will become more apparent by describing in detail exemplary embodiments thereof with reference to the attached drawings, in which:

FIG. 8 is a flow chart illustrating that a signal receiving device of a memory device operates in an EOM enable mode, according to example embodiments;

FIGS. 9 to 16 are views illustrating that a signal receiving device of a memory device operates in an EOM enable mode, according to example embodiments;

DETAILED DESCRIPTION

Hereinafter, the embodiments according to technical spirits of the present disclosure will be described with reference to the accompanying drawings.

Figure 1:
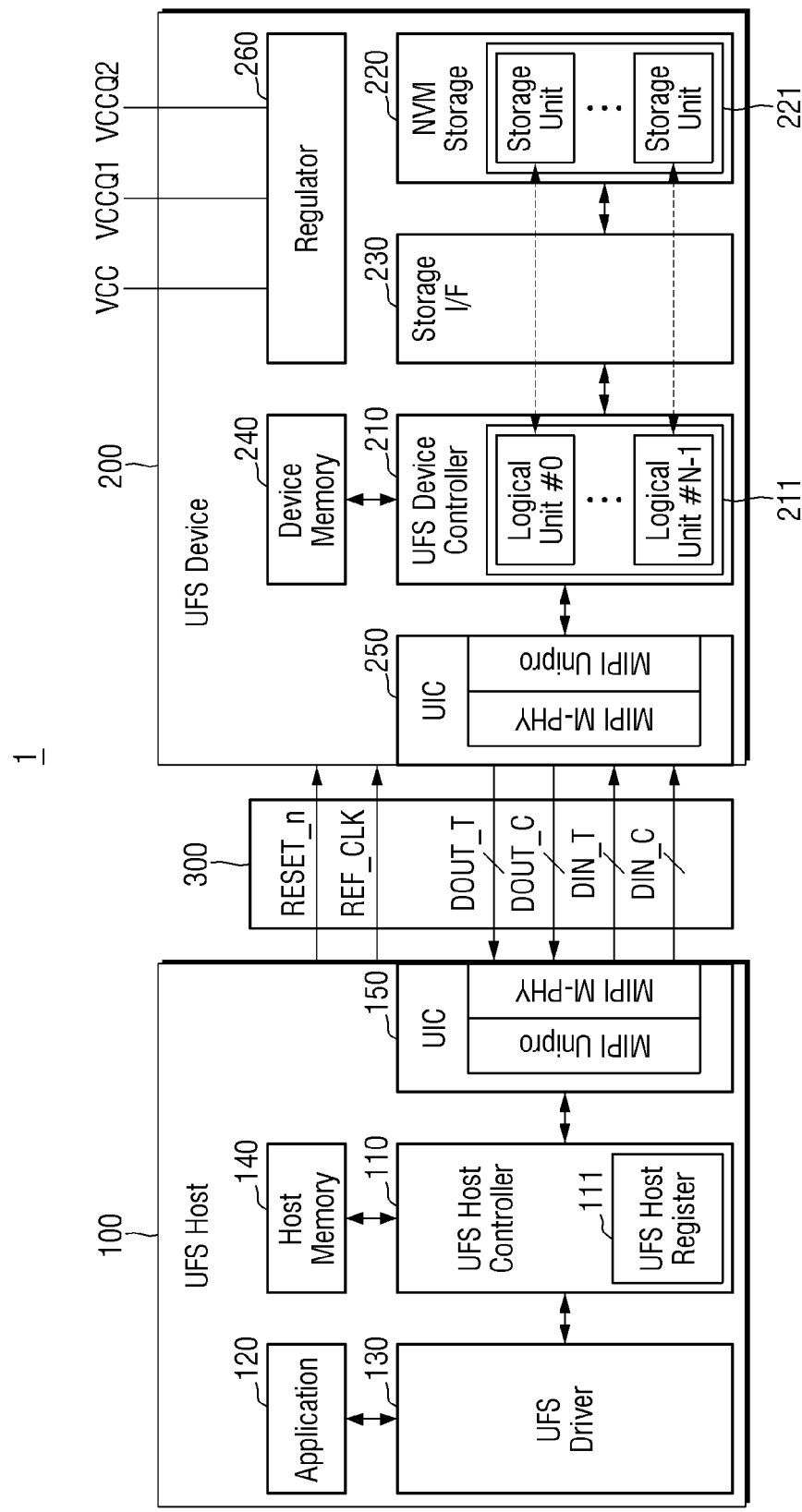
FIG. 1 is a view illustrating a memory system according to some embodiments of the present disclosure.
Figure 2:
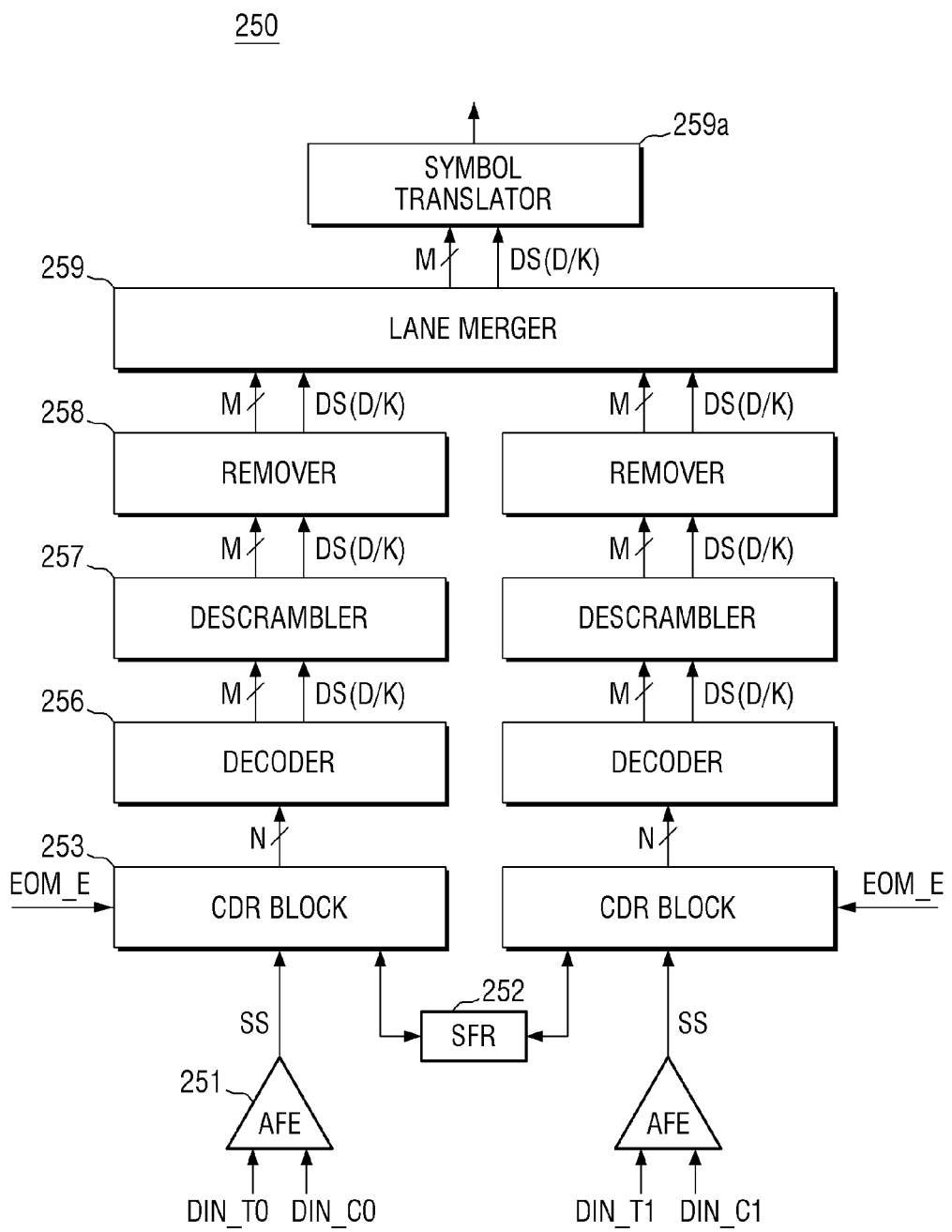
FIG. 2 is a view illustrating a UFS interconnect (UIC) layer according to example embodiments.
Figure 3:
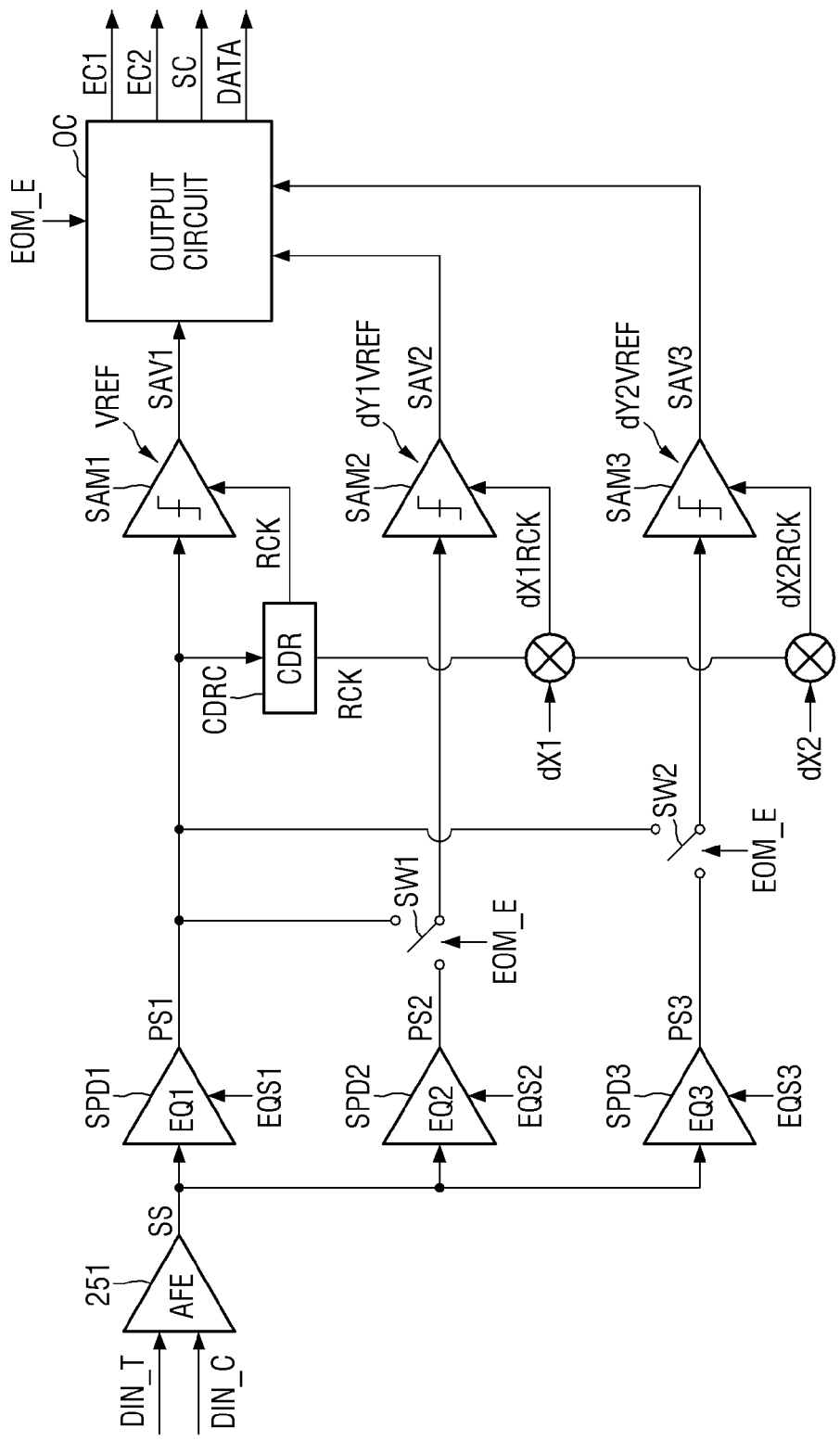
FIG. 3 is a view illustrating a CDR block of FIG. 2 according to example embodiments.
Figure 4:
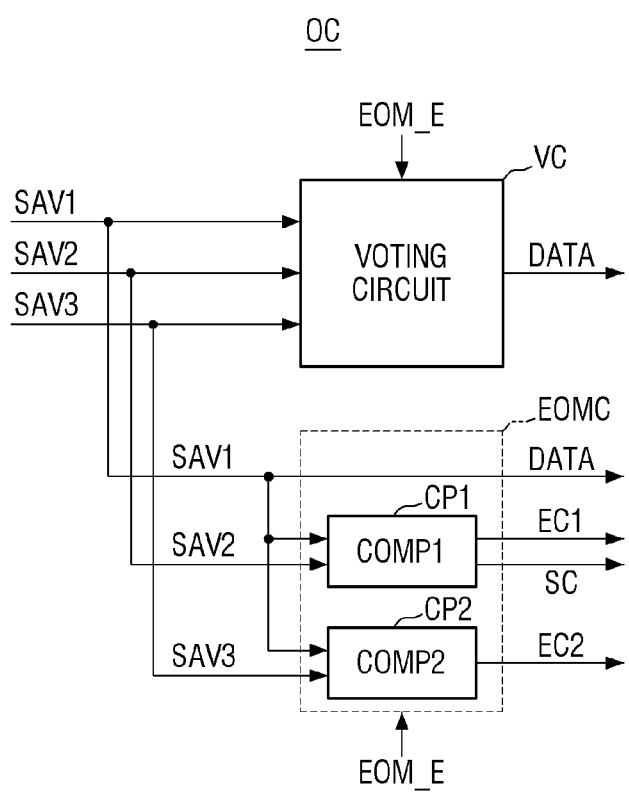
FIG. 4 is a view illustrating an output circuit of FIG. 3 according to example embodiments.

FIG. 1 is a view illustrating a memory system according to some embodiments of the present disclosure. FIG. 2 is a view illustrating a UFS interconnect (UIC) layer according to example embodiments. FIG. 3 is a view illustrating a CDR block of FIG. 2 according to example embodiments. FIG. 4 is a view illustrating an output circuit of FIG. 3 according to example embodiments.

Hereinafter, a system that follows the Universal Flash Storage (UFS) standard published by Joint Electron Device Engineering Council (JEDEC) will be described as a memory system according to technical spirits of the present disclosure by way of example, but the technical spirits of the present disclosure are not limited thereto, and various modifications may be made in aspects of the memory system carried out within the range of the same technical spirits.

Referring to FIG. 1, the memory system 1 may include a host device (or a UFS host) 100, a memory device (or a UFS device) 200 and a UFS interface 300.

The host device 100 and the memory device 200 may be interconnected through the UFS interface 300. In some embodiments, the host device 100 may be implemented as a portion of an application processor.

The host device 100 may include a UFS host controller 110, an application 120, a UFS driver 130, a host memory 140, and a UFS interconnect (UIC) layer 150.

The memory device 200 may include a UFS device controller 210, a non-volatile storage 220, a storage interface 230, a device memory 240, a UIC layer 250, and a regulator 260.

The non-volatile storage 220 may include a plurality of storage units 221, and each of the storage units 221 may include a Vertical-NAND (V-NAND) flash memory of a 2D or 3D structure, but may include other types of non-volatile memories such as phase random access memory (PRAM) and/or resistive random access memory (RRAM).

The UFS device controller 210 and the non-volatile storage 220 may be connected to each other through the storage interface 230. The storage interface 230 may be implemented to comply with standard regulations, such as Toggle or open NAND flash interface (ONFI). The operation between the UFS device controller 210 and the non-volatile storage 220 using Toggle will be described later.

The application 120 may mean a program that desires to perform communication with the memory device 200 to use functions of the memory device 200. The application 120 may transmit an input-output request (IOR) to the UFS driver 130 for input and output for the memory device 200. The IOR may mean a read request, a write request, and/or an erase request of data, but is not limited thereto.

The UFS driver 130 may manage the UFS host controller 110 through a UFS-Host Controller Interface (UFS-HCI). The UFS driver 130 may convert the IOR generated by the application 120 into a UFS command defined by the UFS standard and transfer the converted UFS command to the UFS host controller 110. One IOR may be converted into a plurality of UFS commands. The UFS command may basically be a command defined by a Small Computer System Interface (SCSI) standard, but may be a UFS standard dedicated command.

The UFS host controller 110 may transmit the UFS command converted by the UFS driver 130 to the UIC layer 250 of the memory device 200 through the UIC layer 150 and the UFS interface 300. In this process, a UFS host register 111 of the UFS host controller 110 may serve as a command queue (CQ).

The UIC layer 150 on a side of the host device 100 may include MIPI_M-PHY and the MIPI Unipro, and the UIC layer 250 on a side of the memory device 200 may also include MIPI_M-PHY and MIPI Unipro.

The UFS interface 300 may include a line for transmitting a reference clock REF_CLK, a line for transmitting a hardware reset signal RESET_n for the memory device 200, a pair of lines for transmitting a differential input signal pair DIN_T and DIN_C, and a pair of lines for transmitting a differential output signal pair DOUT_T and DOUT_C. In some embodiments, the UFS interface 300 may include two or more differential input signal pair of lines and two or more differential output signal pair of lines.

A frequency value of the reference clock REF_CLK provided from the host device 100 to the memory device 200 may be one of four values of 19.2 MHz, 26 MHz, 38.4 MHz and 52 MHz, but is not limited thereto. The host device 100 may change the frequency value of the reference clock REF_CLK even when data transmission/reception is performed between the host device 100 and the memory device 200.

The memory device 200 may generate a clock of various frequencies from the reference clock REF_CLK provided from the host device 100 using a phase-locked loop (PLL) or the like. In addition, the host device 100 may set a value of a data rate between the host device 100 and the memory device 200 through the frequency value of the reference clock REF_CLK. For example, the value of the data rate may be determined depending on the frequency value of the reference clock REF_CLK.

The UFS interface 300 may support multiple lanes, each of which may be implemented in a differential pair. For example, the UFS interface 300 may include one or more receive lanes and one or more transmit lanes. In FIG. 1, a pair of lines for transmitting the differential input signal pair DIN_T and DIN_C may constitute a receive lane, and a pair of lines for transmitting the differential output signal pair DOUT_T and DOUT_C may constitute a transmit lane.

Although one transmit lane and one receive lane are shown in FIG. 1, the number of transmit lanes and receive lanes may be modified.

The receive lane and the transmit lane may transmit data in a serial communication method, and full-duplex communication between the host device 100 and the memory device 200 is possible by a structure in which the receive lane and the transmit lane are separated from each other. For example, the memory device 200 may transmit data to the host device 100 through the transmit lane even while receiving data from the host device 100 through the receive lane. In addition, control data such as commands from the host device 100 to the memory device 200 and user data to be stored by the host device 100 in the non-volatile storage 220 of the memory device 200 or to be read from the non-volatile storage 220 may be transmitted through the same lane. Therefore, there is no need for a separate lane for data transmission between the host device 100 and the memory device 200 in addition to a pair of receive lanes and a pair of transmit lanes.

Referring to FIG. 2, the UIC layer 250 serving as a signal receiving device of the memory device 200 may include two analog front ends (AFE) 251, two clock data recovery (CDR) blocks 253, two decoders 256, two descramblers 257, two symbol removers 258, a lane merger 259 and a symbol translator 259a.

The AFE 251 may receive the differential input signal pair DIN_T and DIN_C from the host device 100 (FIG. 1), and may perform a predetermined process to output a serial signal SS. For example, the left AFE 251 may receive a differential input signal pair DIN_T0 and DIN_C0 and the right AFE 251 may receive a differential input signal pair DIN_T1 and DIN_C1. In some embodiments, the host device 100 (FIG. 1) may provide the differential input signal pair DIN_T and DIN_C, which are the serial signals, to the AFE 251, and the AFE 251 may output the serial signal SS therefrom.

The CDR block 253 may perform a clock data recovery (CDR) and a data deserialization to output a signal of N bits (N is a natural number). In example embodiments, the CDR block 253 may perform majority voting based on the input serial signal SS in an EOM disable mode to extract data, and may perform an EOM operation in an EOM enable mode to measure signal quality of a communication channel with the host device 100 (FIG. 1) based on the input serial signal SS.

In some embodiments, the EOM operation performed by the CDR block 253 may be performed using, for example, a Special Function Register (SFR) 252, but the embodiments are not limited thereto.

Referring to FIG. 3, the CDR block 253 may include signal processing devices SPD1 to SPD3, a clock recovery circuit CDRC, samplers SAM1 to SAM3, switches SW1 and SW2, and an output circuit OC.

The plurality of signal processing devices SPD1 to SPD3 may perform their respective processing with respect to the serial signal SS.

The signal processing device SPD1 may perform a first processing for the serial signal SS to generate a processed signal PS1, the signal processing device SPD2 may perform a second processing, which is different from the first processing, for the serial signal SS to generate a processed signal PS2, and the signal processing device SPD3 may perform a third processing, which is different from the first processing and the second processing, for the serial signal SS to generate a processed signal PS3. In this case, the first processing to the third processing may be different from one another.

In some embodiments, the signal processing device SPD1 may include an equalizer EQ1 set to, for example, a first set value EQS1, the signal processing device SPD2 may include an equalizer EQ2 set to, for example, a second set value EQS2 different from the first set value EQS1, and the signal processing device SPD3 may include an equalizer EQ3 set to, for example, a third set value EQS3 different from the first and second setting values EQS1 and EQS2. For example, each of the first to third set values EQS1 to EQS3 may include a binary code.

In this case, the signal processing device SPD1 may perform equalizing for the serial signal SS with the first set value EQS1 to generate the processed signal PS1, the signal processing device SPD2 may perform equalizing for the serial signal SS with the second set value EQS2 to generate the processed signal PS2, and the signal processing device SPD3 may perform equalizing for the serial signal SS with the third set value EQS3 to generate the processed signal PS3.

Although FIG. 3 illustrates that the signal processing devices SPD1 to SPD3 include the equalizers EQ1 to EQ3 respectively, the embodiments according to the technical spirits of the present disclosure are not limited thereto.

The clock recovery circuit CDRC may recover the clock based on the serial signal SS, and may output a recovered clock signal RCK. For example, the clock recovery circuit CDRC may recover the clock from the processed signal PS1 by performing a clock data recovery (CDR), and may output the recovered clock signal RCK.

The sampler SAM1 may extract a sampling value SAV1 from the processed signal PS1 based on the recovered clock signal RCK provided from the clock recovery circuit CDRC and a reference voltage VREF.

The sampler SAM2 may extract a sampling value SAV2 from the processed signal PS2 based on an offset clock signal dX1RCK in which a horizontal offset dX1 is applied to the recovered clock signal RCK and an offset voltage dY1VREF in which a vertical offset dY1 is applied to the reference voltage VREF.

The sampler SAM3 may extract a sampling value SAV3 from the processed signal PS3 based on an offset clock signal dX2RCK in which a horizontal offset dX2 is applied to the recovered clock signal RCK and an offset voltage dY2VREF in which a vertical offset dY2 is applied to the reference voltage VREF.

In example embodiments, the horizontal offset dX1, the horizontal offset dX2, the vertical offset dY1 and the vertical offset dY2 when the CDR block 253 operates in the EOM disable mode may be different from the horizontal offset dX1, the horizontal offset dX2, the vertical offset dY1 and the vertical offset dY2 when the CDR block 253 operates in the EOM enable mode.

For example, when the CDR block 253 operates in the EOM disable mode, the horizontal offset dX1, the horizontal offset dX2, the vertical offset dY1 and the vertical offset dY2 may all be zero (0). In this case, both the offset clock signal dX1RCK and the offset clock signal dX2RCK may be the same as the recovered clock signal RCK, and both the offset voltage dY1VREF and the offset voltage dY2VREF may be the same as the reference voltage VREF.

On the other hand, when the CDR block 253 operates in the EOM enable mode, the horizontal offset dX1, the horizontal offset dX2, the vertical offset dY1 and the vertical offset dY2 may be different from one another. For example, the horizontal offset dX1 may be different from the horizontal offset dX2, and the vertical offset dY1 may be different from the vertical offset dY2.

In some embodiments, in the case that the CDR block 253 operates in the EOM enable mode, the horizontal offset dX2 may be '−a' when the horizontal offset dX1 is 'a' ('a' is real number). Further, in the case that the CDR block 253 operates in the EOM enable mode, the vertical offset dY2 may be '−b' when the vertical offset dY1 is 'b' (b is real number). However, the embodiments are not limited thereto, and the horizontal offset dX1, the horizontal offset dX2, the vertical offset dY1 and the vertical offset dY2 may be modified differently.

The switch SW1 may be controlled by a control signal EOM_E to determine the processed signal provided to the sampler SAM2. For example, the switch SW1 may connect the signal processing device SPD2 to the sampler SAM2 in response to a signal level of the control signal EOM_E, which is a logical low level indicating the EOM disable. Therefore, the processed signal PS2, which is the output from the signal processing device SPD2, may be provided to the sampler SAM2. Further, the switch SW1 may connect the signal processing device SPD1 to the sampler SAM2 in response to a signal level of the control signal EOM_E, which is a logical high level indicating the EOM enable. Therefore, the processed signal PS1, which is the output from the signal processing device SPD1, may be provided to the sampler SAM2.

The switch SW2 may be controlled by the control signal EOM_E to determine the processed signal provided to the sampler SAM3. For example, the switch SW2 may connect the signal processing device SPD3 to the sampler SAM3 in response to a signal level of the control signal EOM_E, which is a logical low level indicating the EOM disable. Therefore, the processed signal PS3, which is the output of the signal processing device SPD3, may be provided to the sampler SAM3. Further, the switch SW2 may connect the signal processing device SPD1 to the sampler SAM3 in response to a signal level of the control signal EOM_E, which is a logical high level indicating the EOM enable. Therefore, the processed signal PS1, which is the output of the signal processing device SPD1, may be provided to the sampler SAM3.

FIG. 3 illustrates the switch SW1 as an exemplary element for allowing the sampler SAM2 to receive the output from the signal processing device SPD2 in the EOM disable mode and receive the output from the signal processing device SPD1 in the EOM enable mode, and illustrates the switch SW2 as an exemplary element for allowing the sampler SAM3 to receive the output from the signal processing device SPD3 in the EOM disable mode and receive the output from the signal processing device SPD1 in the EOM enable mode, but the embodiments are not limited thereto. The embodiments may be carried out by modification to other elements that may change the processed signals provided to the samplers SAM2 and SAM3 depending on the mode.

Referring to FIGS. 3 and 4, the output circuit OC may include a voting circuit VC and an EOM circuit EOMC.

The voting circuit VC and the EOM circuit EOMC may be enabled depending on the control signal EOM_E.

The voting circuit VC may be enabled in response to the signal level of the control signal EOM_E, which is a logical low level indicating the EOM disable, and may be disabled in response to the signal level of the control signal EOM_E, which is a logical high level indicating the EOM enable.

The EOM circuit EOMC may be disabled in response to the signal level of the control signal EOM_E, which is a logical low level indicating the EOM disable, and may be enabled in response to the signal level of the control signal EOM_E, which is a logical high level indicating the EOM enable.

For example, in the EOM disable mode in which the EOM operation is not performed, the voting circuit VC may be enabled to perform majority voting for the sampling values SAV1 to SAV3, thereby outputting data DATA. In the EOM enable mode in which the EOM operation is performed, the EOM circuit EOMC may be enabled to output the data DATA based on the sampling value SAV1, and may perform an EOM operation based on the sampling values SAV1 to SAV3 to output error count signals EC1 and EC2 and a sampling count signal SC. For example, the data DATA may correspond to a signal of N bis output from the CDR block 253 of FIG. 2. A detailed operation of the voting circuit VC and the EOM circuit EOMC will be described later.

In some embodiments, the EOM circuit EOMC may include a comparator CP1 for comparing the sampling value SAV1 with the sampling value SAV2 to output the error count signal EC1 and the sampling count signal SC and a comparator CP2 for comparing the sampling value SAV1 with the sampling value SAV3 to output the error count signal EC2, but the embodiments are not limited thereto.

Referring back to FIG. 2, the decoder 256 may decode the N-bit signal output from the CDR block 253 into M-bit (M is a natural number smaller than N) signal and a distinguishing signal DS. In some embodiments, the N-bit signal is a 10-bit signal, and the M-bit signal may be an 8-bit signal, but the embodiments are not limited thereto.

The decoder 256 may output a data signal D as the distinguishing signal DS when the input N-bit signal is a data symbol, and may output a control signal K as the distinguishing signal DS when the input N-bit signal is a control symbol.

The descrambler 257 may perform descrambling for the input M-bit signal and output the descrambled signal. The symbol remover 258 may remove a skip symbol, such as a marker and filler symbol from the input M-bit signal. The lane merger 259 may merge the signals input to each lane and provide the merged signals to the symbol translator 259a. The symbol translator 259a may translate and output the symbols.

Referring back to FIG. 1, the UFS device controller 210 of the memory device 200 may generally control the operation of the memory device 200.

The UFS device controller 210 may manage the non-volatile storage 220 through a logical unit (LU) 211 that is a logical data storage unit. The number of logical units 211 may be, for example, eight, but the embodiments are not limited thereto.

The UFS device controller 210 may include a flash translation layer (FTL), and may convert a logical data address, for example, a logical block address (LBA) transferred from the host device 100, into a physical data address, for example, a physical block address (PBA) or a physical page number (PPN), by using address mapping information of the FTL. In the memory system 1, a logical block for storing user data may have a size of a predetermined range. For example, a minimum size of the logical block may be set to 4K bytes.

When a command from the host device 100 is input to the memory device 200 through the UIC layer 250, the UFS device controller 210 may perform an operation according to an input command, and may transmit a completion response to the host device 100 when the operation is completed.

For example, when the host device 100 desires to store user data in the memory device 200, the host device 100 may transmit a data write command to the memory device 200. When a ready-to-transfer response for the user data is received from the memory device 200, the host device 100 may transmit the user data to the memory device 200. The UFS device controller 210 may temporarily store the received user data in the device memory 240 and store the user data temporarily stored in the device memory 240 in a selected position of the non-volatile storage 220 based on address mapping information of the FTL.

As another example, when the host device 100 desires to read the user data stored in the memory device 200, the host device 100 may transmit a data read command to the memory device 200. The UFS device controller 210 that has received the command may read the user data from the non-volatile storage 220 based on the data read command and temporarily store the read user data in the device memory 240. In this read process, the UFS device controller 210 may detect and correct an error of the read user data by using an embedded error correction code (ECC) circuit (not shown). The UFS device controller 210 may transmit the user data temporarily stored in the device memory 240 to the host device 100.

Also, the UFS device controller 210 may further include an advanced encryption standard (AES) circuit (not shown) that may encrypt or decrypt the data input to the UFS device controller 210 by using a symmetric-key algorithm.

The host device 100 may store commands to be transmitted to the memory device 200 in the UFS host register 111, which may serve as a command queue, in due order, and may transmit the commands to the memory device 200 in the order. At this time, the host device 100 may transmit next command waiting in the command queue to the memory device 200 even when the previously transmitted command is still being processed by the memory device 200, i.e., even before it is notified that the previously transmitted command has been processed by the memory device 200. Therefore, the memory device 200 may also receive next command from the host device 100 even in the middle of processing the previously transmitted command. The maximum number of commands (queue depth) that may be stored in such a command queue may be, for example, 32. In addition, the command queue may be implemented in a circular queue type indicating start and end of a command column stored in the queue through a head pointer and a tail pointer.

Each of the plurality of storage units 221 may include a memory cell array (not shown) and a control circuit (not shown) for controlling an operation of the memory cell array. The memory cell array may include a two-dimensional memory cell array or a three-dimensional memory cell array. The memory cell array may include a plurality of memory cells, each of which may be a single level cell (SLC) that stores information of 1 bit, but may be a cell, which stores information of 2 bits or more, such as a Multi-Level Cell (MLC), a Triple Level Cell (TLC) and a Quadruple Level Cell (QLC). The three-dimensional memory cell array may include a vertical NAND string that is vertically oriented such that at least one memory cell is positioned above another memory cell. Regarding this, a detailed description will be made later.

VCC, VCCQ1, VCCQ2 and the like may be input to the memory device 200 as power voltages. The VCC is a main power voltage for the memory device 200, and may have a value of 2.4V to 3.6V, for example. The VCCQ1 is a power voltage for supplying a voltage of a low range, and is mainly for the UFS device controller 210. For example, the VCCQ1 may have a value of 1.14V to 1.26V. The VCCQ2 is a power voltage for supplying a voltage in a range lower than the VCC but higher than the VCCQ1, and is mainly for an input and output interface such as MIPI M-PHY 251 and may have a value of 1.7V to 1.95V, for example. The power voltages may be supplied for respective elements of the memory device 200 through the regulator 260. The regulator 260 may be implemented as a set of unit regulators respectively connected to different ones of the aforementioned power voltages.

Figure 5:
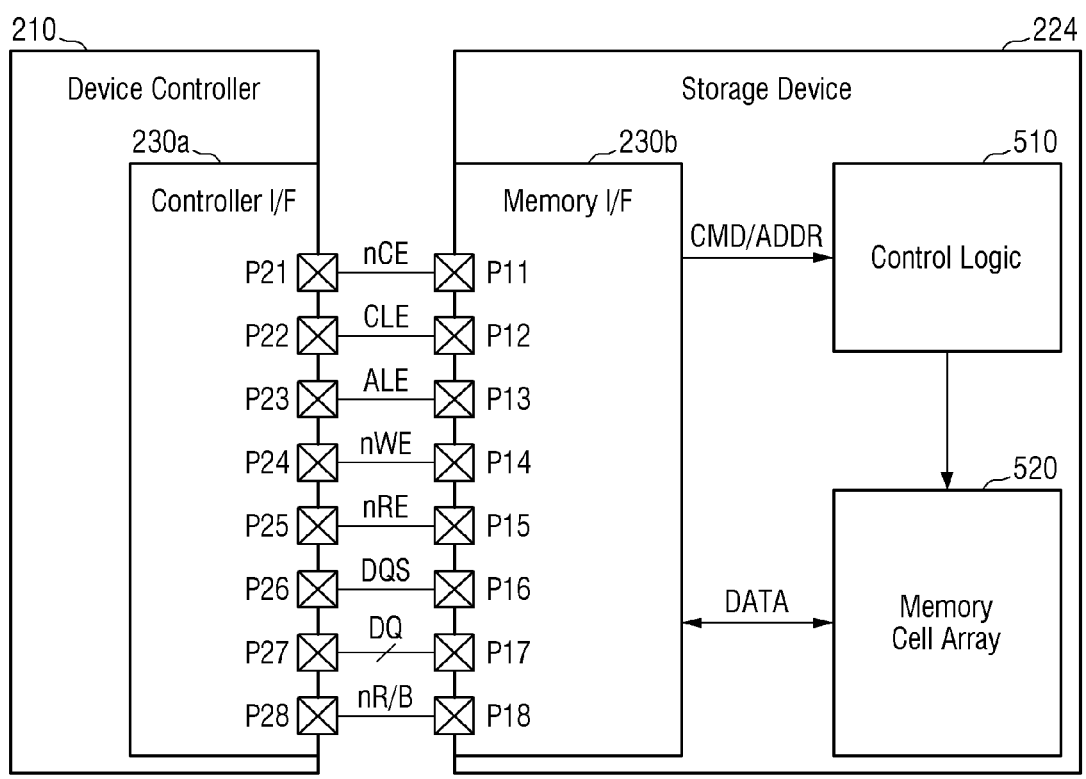
FIG. 5 is a view illustrating that a UFS device controller, a storage interface and a non-volatile storage of FIG. 1 are reconfigured, according to example embodiments.

FIG. 5 is a view illustrating that the UFS device controller, the storage interface and the non-volatile storage of FIG. 1 are reconfigured, according to example embodiments.

The storage interface 230 of FIG. 1 may include a controller interface circuit 230a and a memory interface circuit 230b of FIG. 5. In some embodiments, a storage device (or a non-volatile memory device) 224 shown in FIG. 5 may correspond to one storage unit 221 of FIG. 1. Also, in some embodiments, the storage device 224 may correspond to the non-volatile storage 220 of FIG. 1.

The storage device 224 may include first to eighth pins P11 to P18, a memory interface circuit 230b, a control logic circuit 510 and a memory cell array 520.

The memory interface circuit 230b may receive a chip enable signal nCE from the device controller 210 through the first pin P11. The memory interface circuit 230b may transmit and receive signals to and from the device controller 210 through the second to eighth pins P12 to P18 in accordance with the chip enable signal nCE. For example, when the chip enable signal nCE is an enable state (e.g., low level), the memory interface circuit 230b may transmit and receive signals to and from the device controller 210 through the second to eighth pins P12 through P18.

The memory interface circuit 230b may receive a command latch enable signal CLE, an address latch enable signal ALE and a write enable signal nWE from the device controller 210 through the second to fourth pins P12 to P14. The memory interface circuit 230b may receive a data signal DQ from the device controller 210 or transmit the data signal DQ to the device controller 210, through the seventh pin P17. A command CMD, an address ADDR and data DATA may be transferred through the data signal DQ. For example, the data signal DQ may be transferred through a plurality of data signal lines. In this case, the seventh pin P17 may include a plurality of pins corresponding to a plurality of data signals.

The memory interface circuit 230b may acquire the command CMD from the data signal DQ received at an enable period (e.g., high level state) of the command latch enable signal CLE based on toggle timings of the write enable signal nWE. The memory interface circuit 230b may acquire the address ADDR from the data signal DQ received at an enable period (e.g., high level state) of the address latch enable signal ALE based on the toggle timings of the write enable signal nWE.

In some embodiments, the write enable signal nWE may maintain a static state (e.g., high level or low level), and may be toggled between the high level and the low level. For example, the write enable signal nWE may be toggled at a period where the command CMD or the address ADDR is transmitted. Therefore, the memory interface circuit 230b may obtain the command CMD or the address ADDR based on the toggle timings of the write enable signal nWE.

The memory interface circuit 230b may receive a read enable signal nRE from the device controller 210 through the fifth pin P15. The memory interface circuit 230b may receive a data strobe signal DQS from the device controller 210 or transmit the data strobe signal DQS to the device controller 210 through the sixth pin P16.

In the data DATA output operation of the storage device 224, the memory interface circuit 230b may receive a toggling read enable signal nRE through the fifth pin P15 before outputting the data DATA. The memory interface circuit 230b may generate a toggling data strobe signal DQS based on toggling of the read enable signal nRE. For example, the memory interface circuit 230b may generate a data strobe signal DQS that starts to toggle after a predetermined delay (e.g., tDQSRE) based on a toggling start time of the read enable signal nRE. The memory interface circuit 230b may transmit the data signal DQ, which includes data DATA, based on the toggle timing of the data strobe signal DQS. Therefore, the data DATA may be aligned at the toggle timing of the data strobe signal DQS and transmitted to the device controller 210.

In the data DATA input operation of the storage device 224, when the data signal DQ, which includes the data DATA, is received from the device controller 210, the memory interface circuit 230b may receive the toggling data strobe signal DQS together with the data DATA from the device controller 210. The memory interface circuit 230b may acquire the data DATA from the data signal DQ based on the toggle timing of the data strobe signal DQS. For example, the memory interface circuit 230b may acquire the data DATA by sampling the data signal DQ at a rising edge and/or a falling edge of the data strobe signal DQS.

The memory interface circuit 230b may transmit ready/busy output signals nR/B to the device controller 210 through the eighth pin P18. The memory interface circuit 230b may transmit state information of the storage device 224 to the device controller 210 through the ready/busy output signals nR/B. When the storage device 224 is in a busy state (i.e., when internal operations of the storage device 224 are being performed), the memory interface circuit 230b may transmit the ready/busy output signals nR/B indicating a busy state to the device controller 210. When the storage device 224 is in a ready state (i.e., when internal operations of the storage device 224 are not performed, or are completed), the memory interface circuit 230b may transmit the ready/busy output signals nR/B indicating a ready state to the device controller 210. For example, while the storage device 224 is reading the data DATA from the memory cell array 520 in response to a page read command, the memory interface circuit 230b may transmit the ready/busy output signals nR/B indicating a busy state (e.g., low level) to the device controller 210. For example, while the storage device 224 is programming the data DATA into the memory cell array 520 in response to a program command, the memory interface circuit 230b may transmit the ready/busy output signals nR/B indicating a busy state to the device controller 210.

The control logic circuit 510 may generally control various operations of the storage device 224. The control logic circuit 510 may receive the command/address CMD/ADDR acquired from the memory interface circuit 230b. The control logic circuit 510 may generate control signals for controlling other elements of the storage device 224 in accordance with the received command/address CMD/ADDR. For example, the control logic circuit 510 may program the data DATA into the memory cell array 520, or may generate various control signals for reading the data DATA from the memory cell array 520.

The memory cell array 520 may store the data DATA acquired from the memory interface circuit 230b under the control of the control logic circuit 510. The memory cell array 520 may output the stored data DATA to the memory interface circuit 230b under the control of the control logic circuit 510.

The memory cell array 520 may include a plurality of memory cells. For example, the plurality of memory cells may be flash memory cells, but the present disclosure is not limited thereto. For example, the memory cells may be at least one of resistive random access memory (RRAM) cells, ferroelectric random access memory (FRAM) cells, phase change random access memory (PRAM) cells, thyristor random access memory (TRAM) cells, and magnetic random access memory (MRAM) cells. Hereinafter, the embodiments of the present disclosure will be described based on an embodiment in which memory cells are NAND flash memory cells.

The device controller 210 may include first to eighth pins P21 to P28 and a controller interface circuit 230a. The first to eighth pins P21 to P28 may correspond to the first to eighth pins P11 to P18 of the storage device 224.

The controller interface circuit 230a may transmit the chip enable signal nCE to the storage device 224 through the first pin P21. The controller interface circuit 230a may transmit and receive signals to and from the storage device 224, which is selected through the chip enable signal nCE, through the second to eighth pins P22 to P28.

The controller interface circuit 230a may transmit the command latch enable signal CLE, the address latch enable signal ALE and the write enable signal nWE to the storage device 224 through the second to fourth pins P22 to P24. The controller interface circuit 230a may transmit the data signal DQ to the storage device 224 or receive the data signal DQ from the storage device 224 through the seventh pin P27.

The controller interface circuit 230a may transmit the data signal DQ, which includes the command CMD or the address ADDR, to the storage device 224 together with a toggling write enable signal nWE. The controller interface circuit 230a may transmit the data signal DQ, which includes the command CMD, to the storage device 224 in accordance with transmission of the command latch enable signal CLE having an enable state, and may transmit the data signal DQ, which includes the address ADDR, to the storage device 224 in accordance with transmission of the address latch enable signal ALE having an enable state.

The controller interface circuit 230a may transmit the read enable signal nRE to the storage device 224 through the fifth pin P25. The controller interface circuit 230a may receive the data strobe signal DQS from the storage device 224 or transmit the data strobe signal DQS to the storage device 224 through the sixth pin P26.

In the data DATA output operation of the storage device 224, the controller interface circuit 230a may receive the toggling read enable signal nRE, and may transmit the read enable signal nRE to the storage device 224. For example, the controller interface circuit 230a may generate the read enable signal nRE that is changed from a static state (e.g., high level or low level) to a toggle state before the data DATA is output. Therefore, the toggling data strobe signal DQS may be generated by the storage device 224 based on the read enable signal nRE. The controller interface circuit 230a may receive the data signal DQ, which includes the data DATA, from the storage device 224 together with the toggling data strobe signal DQS. The controller interface circuit 230a may acquire the data DATA from the data signal DQ based on the toggle timing of the data strobe signal DQS.

In the data DATA input operation of the storage device 224, the controller interface circuit 230a may generate the toggling data strobe signal DQS. For example, the controller interface circuit 230a may generate a data strobe signal DQS that is changed from a static state (e.g., high level or low level) to a toggle state before transmitting the data DATA. The controller interface circuit 230a may transmit the data signal DQ, which includes the data DATA, to the storage device 224 based on toggle timings of the data strobe signal DQS.

The controller interface circuit 230a may receive the ready/busy output signals nR/B from the storage device 224 through the eighth pin P28. The controller interface circuit 230a may determine state information of the storage device 224 based on the ready/busy output signals nR/B.

Figure 6:
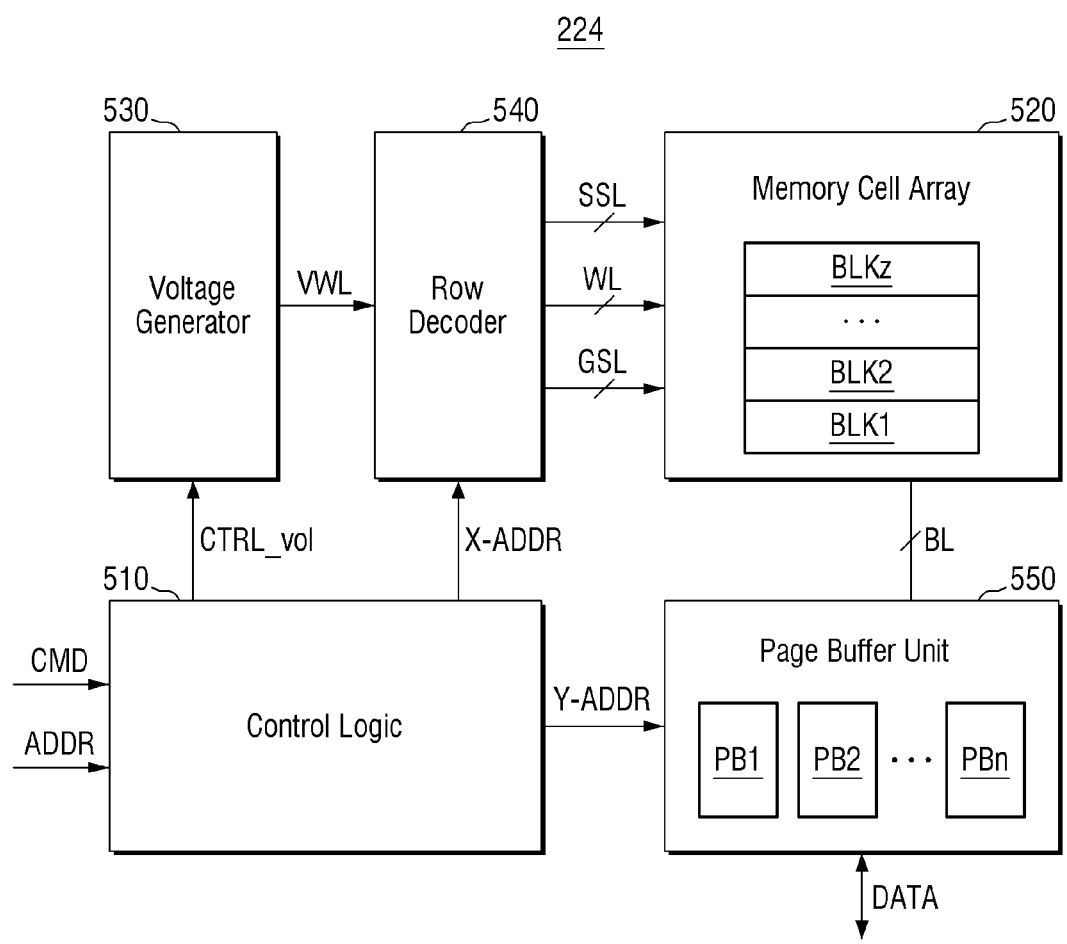
FIG. 6 is an exemplary block view illustrating a storage device of FIG. 5 according to example embodiments.

FIG. 6 is an exemplary block view illustrating the storage device of FIG. 5 according to example embodiments.

Referring to FIG. 6, the storage device 224 may include a control logic circuit 510, a memory cell array 520, a page buffer unit 550, a voltage generator 530 and a row decoder 540. Although not shown in FIG. 6, the storage device 224 may further include a memory interface circuit 230b shown in FIG. 5, and may further include a column logic, a pre-decoder, a temperature sensor, a command decoder, an address buffer and the like.

The control logic circuit 510 may generally control various operations within the storage device 224. The control logic circuit 510 may output various control signals in response to the command CMD and/or the address ADDR from the memory interface circuit 230b. For example, the control logic circuit 510 may output a voltage control signal CTRL_vol, a row address X_ADDR and a column address Y_ADDR.

The memory cell array 520 may include a plurality of memory blocks BLK1 to BLKz (z is a positive integer), each of which may include a plurality of memory cells. The memory cell array 520 may be connected to the page buffer unit 550 through bit lines BL, and may be connected to the row decoder 540 through word lines WL, string selection lines SSL and ground selection lines GSL.

In an exemplary embodiment, the memory cell array 520 may include a three-dimensional memory cell array, wherein the three-dimensional memory cell array may include a plurality of NAND strings. Each NAND string may include memory cells respectively connected to word lines vertically deposited on a substrate. The U.S. Pat. No. 7,679,133, the U.S. Pat. No. 8,553,466, the U.S. Pat. No. 8,654,587, the U.S. Pat. No. 8,559,235 and the US Patent Application Publication No. 2011/0233648 are incorporated herein by reference. In an exemplary embodiment, the memory cell array 520 may include a two-dimensional memory cell array, wherein the two-dimensional memory cell array may include a plurality of NAND strings disposed along row and column directions.

The page buffer unit 550 may include a plurality of page buffers PB1 to PBn (n is an integer greater than or equal to 3), wherein the plurality of page buffers PB1 to PBn may respectively be connected to the memory cells through the bit lines BL. The page buffer unit 550 may select at least one of the bit lines BL in response to the column address Y_ADDR. The page buffer unit 550 may operate as a write driver or a sense amplifier in accordance with an operation mode. For example, during a program operation, the page buffer unit 550 may apply a bit line voltage corresponding to data, which will be programmed, to the selected bit line. During a read operation, the page buffer unit 550 may sense a current or voltage of the selected bit line to sense data stored in the memory cell.

The voltage generator 530 may generate various types of voltages for performing program, read and erase operations based on the voltage control signal CTRL_vol. For example, the voltage generator 530 may generate a program voltage, a read voltage, a program verification voltage, an erase voltage and the like as word line voltages VWL.

The row decoder 540 may select one of the plurality of word lines WL in response to the row address X_ADDR, and may select one of a plurality of string selection lines SSL. For example, the row decoder 540 may apply the program voltage and the program verification voltage to the selected word line during the program operation, and may apply the read voltage to the selected word line during the read operation.

Figure 7:
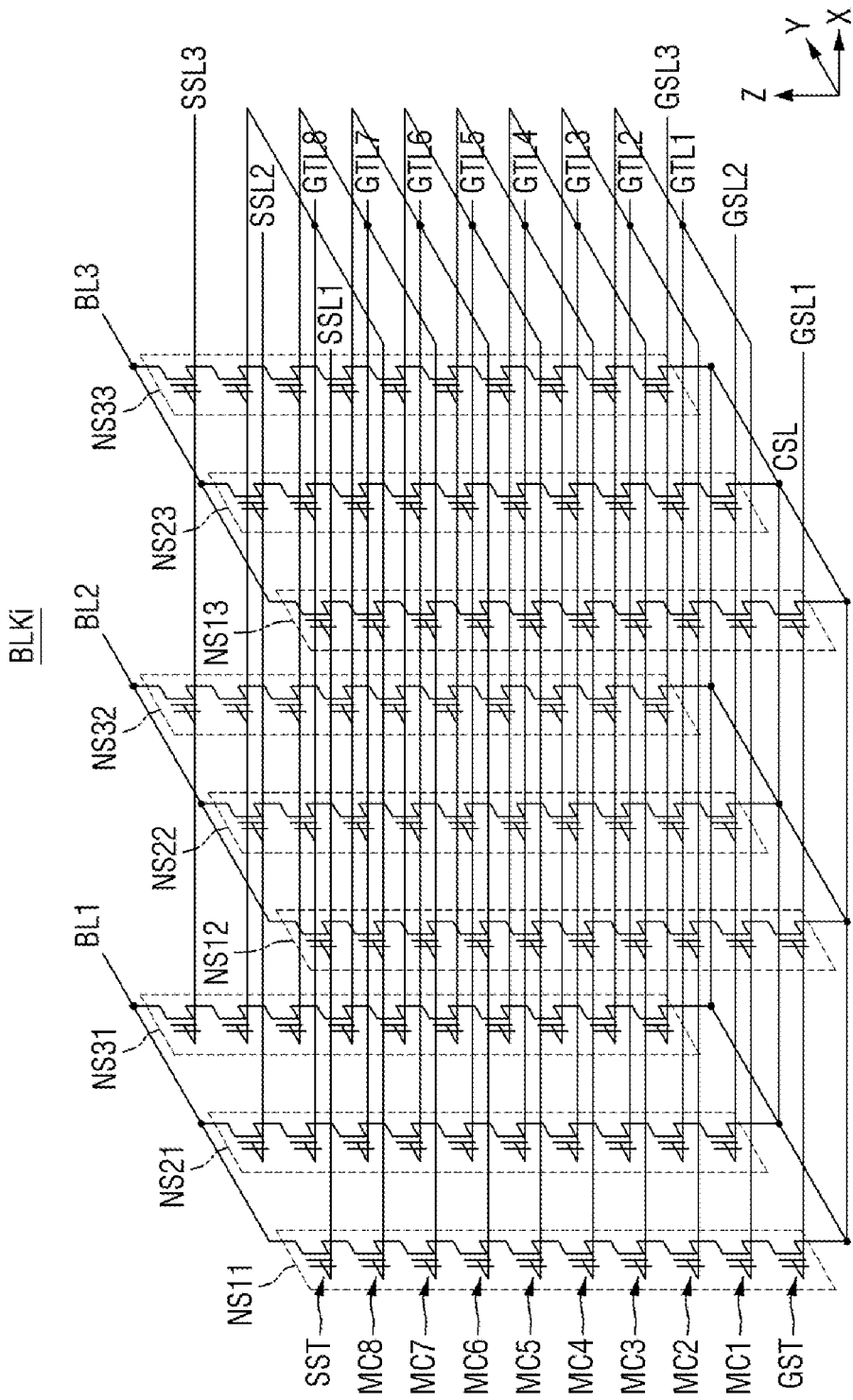
FIG. 7 is a view illustrating a 3D V-NAND structure according to some embodiments of the present disclosure.

FIG. 7 is a view illustrating a 3D V-NAND structure according to some embodiments of the present disclosure.

When a storage module of the UFS device is implemented as a 3D V-NAND type flash memory, each of a plurality of memory blocks constituting the storage module may be represented by an equivalent circuit shown in FIG. 7.

A memory block BLKi shown in FIG. 7 represents a three-dimensional memory block formed on a substrate in a three-dimensional structure. For example, a plurality of memory NAND strings included in the memory block BLKi may be formed in a direction perpendicular to the substrate.

Referring to FIG. 7, the memory block BLKi may include a plurality of memory NAND strings NS11 to NS31, NS12 to NS32, and NS13 to NS33, respectively connected between bit lines BL1, BL2 and BL3 and a common source line CSL. Each of the plurality of memory NAND strings NS11 to NS31, NS12 to NS32, and NS13 to NS33 includes a string selection transistor SST, a plurality of memory cells MC1, MC2, . . . , and MC8, and a ground selection transistor GST. In FIG. 6, each of the plurality of memory NAND strings NS11 to NS31, NS12 to NS32, and NS13 to NS33 includes eight memory cells MC1, MC2, . . . , and MC8, but is not limited thereto.

The string selection transistor SST may be connected to a corresponding string selection line SSL1, SSL2 or SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines, and a portion of the gate lines GTL1, GTL2, . . . , and GTL8 may correspond to a dummy word line. The ground selection transistor GST may be connected to a corresponding ground selection line GSL1, GSL2 or GSL3. The string selection transistor SST may be connected to a corresponding bit line BL1, BL2 or BL3, and the ground selection transistor GST may be connected to the common source line CSL.

The word lines (e.g., WL1) of the same height may commonly be connected, and the ground selection lines GSL1, GSL2 and GSL3 may be separated from the string selection lines SSL1, SSL2 and SSL3, respectively. Although FIG. 7 shows that the memory block BLKi is connected to eight gate lines GTL1, GTL2, . . . , and GTL8 and three bit lines BL1, BL2 and BL3, the present disclosure is not limited thereto.

Figures 8, 9:
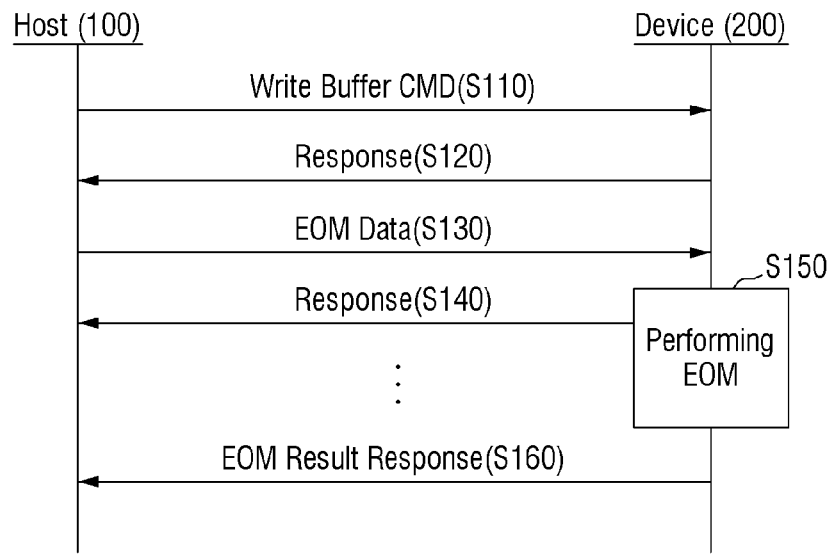

FIG. 8 is a flow chart illustrating that a signal receiving device of a memory device operates in an EOM enable mode, according to example embodiments. FIGS. 9 to 16 are views illustrating that a signal receiving device of a memory device operates in an EOM enable mode, according to example embodiments.

Referring to FIG. 8, the host device 100 transmits a command to request an eye open monitor (EOM) operation to the memory device 200 (S110).

In some embodiments, this request command may be implemented in the form of a WRITE BUFFER COMMAND shown in FIG. 9 according to the JEDEC UFS standard. FIG. 9 is a view illustrating a command descriptor block (CDB) of the WRITE BUFFER COMMAND according to the JEDEC UFS standard, and FIG. 10 illustrates a description of mode field setting values of the WRITE BUFFER COMMAND.

In detail, referring to FIGS. 1, 9 and 10, the UFS host controller 110 of the host device 100 may set a MODE field of the WRITE BUFFER COMMAND to 1F to request the UFS device controller 210 of the memory device 200 to perform the EOM operation.

In some embodiments, the operations of the UFS host controller 110 and the operations of the UFS device controller 210 may be performed as the UFS host controller 110 and the UFS device controller 210 are controlled by predetermined firmware, but the embodiments are not limited thereto.

Referring to the embodiment of FIG. 10, the EOM operation is requested when the setting value of the MODE field of the WRITE BUFFER COMMAND is 1F, but the embodiment is not limited to the illustrated example. If necessary, the set value of the MODE field requesting the EOM operation may be changed to another set value (for example, other setting values, which are set as Reserved in a standard specification, such as 1D and 1E).

Referring to FIGS. 1 and 9, the UFS host controller 110 may transfer a size of EOM data, which will be described later, to the UFS device controller 210 by using a PARAMETER LIST LENGTH field of the WRITE BUFFER COMMAND.

Referring to FIGS. 1 to 3, the UFS device controller 210 that has received the command requesting execution of the EOM operation from the host device 100 may prepare execution of the EOM operation. For example, the UFS device controller 210 may apply a control signal EOM_E of a logic high level indicating EOM enable to the CDR block 253.

Figure 11:
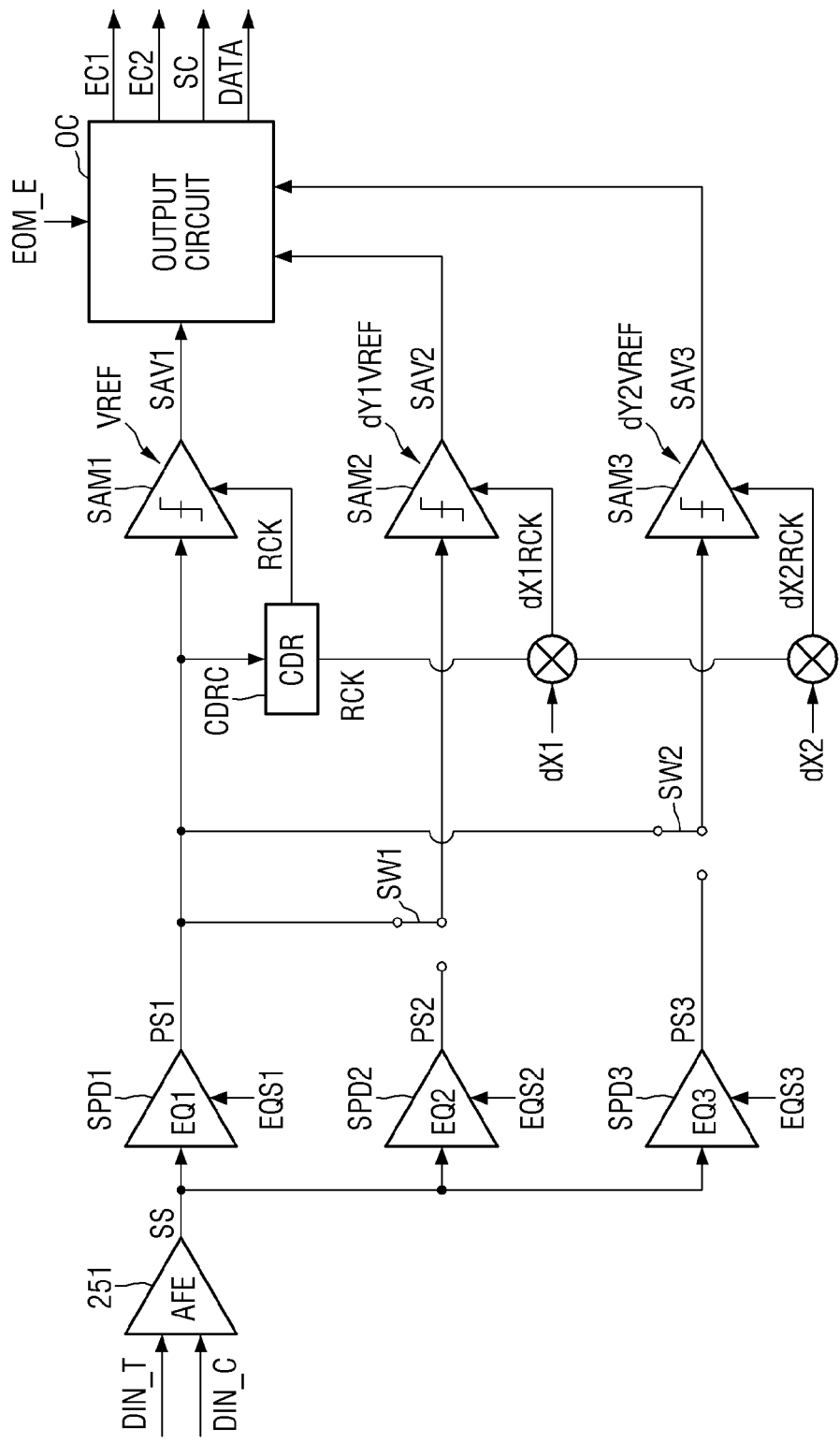

Therefore, as shown in FIG. 11, the switch SW1 connects the signal processing device SPD1 to the sampler SAM2 to provide the processed signal PS1, which is the output of the signal processing device SPD1, to the sampler SAM2. Further, the switch SW2 connects the signal processing device SPD1 to the sampler SAM3 to provide the processed signal PS1, which is the output of the signal processing device SPD1, to the sampler SAM3.

The voting circuit VC (FIG. 4) of the output circuit OC is disabled, and the EOM circuit EOMC (FIG. 4) is enabled.

Referring back to FIG. 8, the memory device 200 transmits a response to the WRITE BUFFER COMMAND to the host device 100 (S120).

In some embodiments, this response may include data capacity information that may be received by the memory device 200. For example, when the memory device 200 responds to the host device 100 using k byte (k is a natural number), the host device 100 may classify data (for example, data required for execution of the EOM operation) to be transmitted to the memory device 200 in a unit of k byte and transmit the data.

Next, referring to FIG. 8, the host device 100 transmits the generated EOM data to the memory device 200 (S130), and the memory device 200 transmits a response to reception of the EOM data to the host device 100 (S140).

In some embodiments, the host device 100 may generate the EOM data required for the EOM operation to be performed in the memory device 200.

A generation timing of the EOM data may be a timing prior to the time (S110) when the host device 100 transmits the command requesting execution of the EOM operation to the memory device 200, or may be a timing later than the time (S120) when the host device 100 receives the response to the WRITE BUFFER COMMAND from the memory device 200.

Also, in some embodiments, the generation timing of the EOM data may be a timing between the time (S110) when the host device 100 transmits the command requesting execution of the EOM operation to the memory device 200 and the time (S120) when the host device 100 receives the response to the WRITE BUFFER COMMAND from the memory device 200. For example, the timing in which the host device 100 generates the EOM data required for the EOM operation to be performed in the memory device 200 may be modified.

In some embodiments, the EOM data generated by the host device 100 may include parameters required for execution of the EOM operation and pattern data required for execution of the EOM operation.

In some embodiments, the parameters required for execution of the EOM operation may include the horizontal offset dX1 and the vertical offset dY1, which are required to perform the EOM operation of the memory device 100, as described above.

The horizontal offset dX1 may include a time offset, a phase offset and the like and the vertical offset dY1 may include a voltage offset and the like, but the embodiments are not limited thereto.

The parameters required for execution of the EOM operation may also include phase resolution information. This phase resolution information may be used by the memory device 200 to receive pattern data from the host device 100.

In some embodiments, the pattern data required for execution of the EOM operation may be the serial signal SS (FIG. 3) provided from the host device 100, which is required for execution of the EOM operation.

In some embodiments, the host device 100 may generate a plurality of pattern data, which may be generated by combination of various bit sequences if possible.

Examples of such pattern data include, but are not limited to, Pseudo Random Binary Sequence (PRBS) data, Compliant Random Access Test Pattern (CRPAT) data, Compliant Jitter Tolerance Pattern (CJTPAT) data and the like.

FIG. 12 is a view illustrating a structure of EOM data transmitted from the host device 100 to the memory device 200 according to some embodiments.

Referring to FIG. 12, the EOM data may include an EOM Data Header EDH and an EOM Data Pattern EDP.

The EOM data header EDH may include parameters required for execution of the EOM operation. For example, a phase select field PHASE SELECT may include a horizontal offset dX1 to be transferred to the memory device 200, and a reference voltage control field VREF CONTROL may include a vertical offset dY1 to be transferred to the memory device 200.

For example, the horizontal offset dX1 shown in FIG. 3 may be provided from the host device 100 to the memory device 200 through the phase select field PHASE SELELCT. In addition, the vertical offset dY1 shown in FIG. 3 may be provided from the host device 100 to the memory device 200 through the reference voltage control field VREF CONTROL.

In some embodiments, the memory device 200 may generate a horizontal offset dX2 by using the horizontal offset dX1 provided from the host device 100. For example, when the horizontal offset dX1 provided from the host device 100 is 'a' ('a' is a real number), the memory device 200 may generate '−a' as the horizontal offset dX2. In addition, when the vertical offset dY1 provided from the host device 100 is 'b' ('b' is a real number), the memory device 200 may generate '−b' as the vertical offset dY2.

Also, in some embodiments, the host device 100 may provide the horizontal offset dX1 and the horizontal offset dX2, which are different from each other, to memory device 200 through the phase select field PHASE SELELCT, and may provide the vertical offset dY1 and the vertical offset dY2, which are different from each other, to memory device 200 through the reference voltage control field VREF CONTROL.

The phase resolution information (gear information) referred to by the memory device 200 to receive pattern data from the host device 100 may be provided from the host device 100 to the memory device 200 through a phase resolution field PHASE RESOLUTION.

The number of sampling times that the memory device 200 executes while performing the EOM operation may be provided from the host device 100 to the memory device 200 through a number of sampling field NUMBER OF SAMPLING.

A size of the pattern data to be received by the memory device 200 from the host device 100 may be provided from the host device 100 to the memory device 200 through a data length field EOM DATA LENGTH.

Although FIG. 12 illustrates an example of the EOM data header EDH comprised of 12 bytes, the embodiments are not limited thereto, and a size of the EOM data header EDH may be modified.

The EOM Data Pattern EDP may include pattern data required for execution of the EOM operation. As shown in FIG. 12, the EOM data pattern EDP may include a plurality of pattern data. In some embodiments, N shown in FIG. 12 may be a natural number greater than 12.

Figure 13:
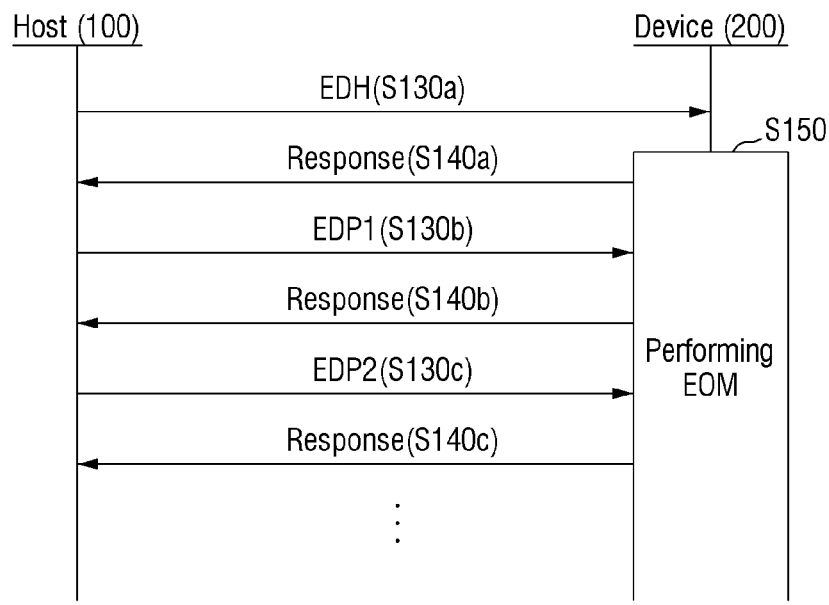

Referring to FIG. 13, the EOM data header EDH and the EOM data pattern EDP may be transmitted from the host device 100 to the memory device 200 over a plurality of times. At this time, the data capacity information responded from the memory device 200 to the host device as information that may be received by the memory device 200 in the step S110 of FIG. 8 may be considered in determining a method of transmitting the EOM data header EDH and the EOM data pattern EDP from the host device 100 to the memory device 200.

For example, when the data capacity information responded from the memory device 200 to the host device 100 in the step S110 of FIG. 8 was 12 bytes, the host device 100 may transmit the EOM data header EDH and the EOM data pattern EDP to the memory device 200 in the same manner as shown in FIG. 12.

In detail, the host device 100 first transmits the EOM data header EDH having a size of 12 bytes to the memory device 200 (S130a). The memory device 200 determines the horizontal offset dX1 and the horizontal offset dX2 and determines the vertical offset dY1 and the vertical offset dY2, based on the EOM data header EDH. In addition, the memory device 200 responds to the host device 100 that the EOM data header EDH has been received (S140a).

Subsequently, the host device 100 transmits the EOM data pattern EDP having a size of 12 bytes to the memory device 200 (S130b).

The memory device 200 that has received the EOM data pattern EDP performs the EOM operation for each EOM data pattern EDP (S150).

In some embodiments, this EOM operation may be performed while the EOM data pattern EDP (FIG. 12) is being received after the EOM data header EDH (FIG. 12) is received. However, the embodiment is not limited to this case, and the EOM operation may be performed after all of the EOM data patterns EDP (FIG. 12) have been received.

The comparators CP1 and CP2 (FIG. 4) may be used for execution of the EOM operation.

Figure 14:
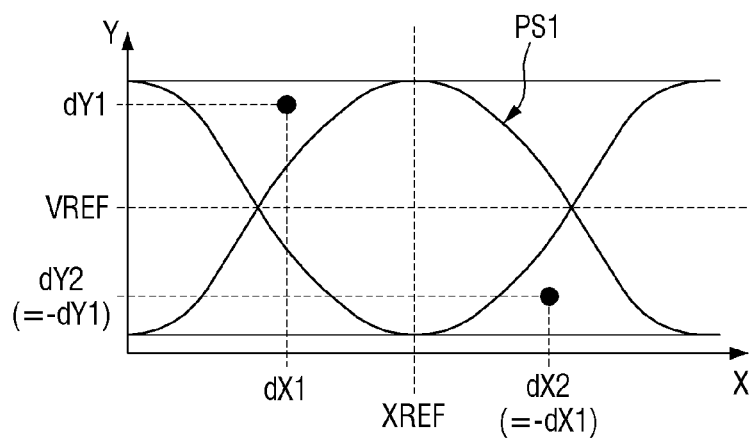

Referring to FIGS. 4, 11 and 14, the comparator CP1 may compare the received serial signal SS with the sampling value SAV1 sampled under reference conditions XREF and VREF and the sampling value SAV2 sampled under the first offset conditions dX1 and dY1 to output the error count signal EC1 and the sampling count signal SC.

For example, when the sampling value SAV2 is recognized as the same value as the sampling value SAV1, the comparator CP1 may not output the error count signal EC1, and when the sampling value SAV2 is not recognized as the same value as the sampling value SAV1, the comparator CP1 may output the error count signal EC1. For example, error counting may be performed by the error count signal EC1 output from the comparator CP1. The comparator CP1 may output the sampling count signal SC whenever such a comparison is performed once. The sampling count signal SC may be used to determine whether the number of sampling times of the number of sampling field NUMBER OF SAMPLING provided from the host device 100 to the memory device 200 is the same as the number of sampling times performed by the memory device 200.

The comparator CP2 compares the received serial signal SS with the sampling value SAV1 sampled under the reference conditions XREF and VREF and the sampling value SAV3 sampled under the second offset conditions dX2 and dY2 to output the error count signal EC2.

For example, when the sampling value SAV3 is recognized as the same value as the sampling value SAV1, the comparator CP2 may not output the error count signal EC2, and when the sampling value SAV3 is not recognized as the same value as the sampling value SAV1, the comparator CP2 may output the error count signal EC2. For example, error counting may be performed by the error count signal EC2 output from the comparator CP2.

In some embodiments, the error count value according to the horizontal offsets dX1, dX2, the vertical offsets dY1 and dY2 and the error count signals EC1 and EC2 and the number of sampling times according to the sampling count signal SC may be stored in the SFR 252 (FIG. 2), but the embodiments are not limited thereto.

In the present embodiment, since EOM operations of twice may be performed for one serial signal SS among the EOM data patterns EDP received from the host device 100 (EOM operations of twice are performed by one sampling count), the EOM may be performed at a high speed. Therefore, the operating speed of the memory device 200 may be improved.

Although FIG. 14 shows an example in which a sum of the horizontal offset dX1 and the horizontal offset dX2 is 0 and a sum of the vertical offset dY1 and the vertical offset dY2 is 0, the embodiments are not limited thereto. The horizontal offset dX1, the horizontal offset dX2, the vertical offset dY1 and the vertical offset dY2 may be carried out by being modified differently.

Referring to FIG. 13, the memory device 200 responds to the host device 100 that the EOM data pattern EDP has been received (S140b). The host device 100 transmits the EOM data pattern EDP having a size of 12 bytes to the memory device 200 (S130c). The memory device 200 responds to the host device 100 that the EOM data pattern EDP has been received (S140c). In this way, the steps are repeated, whereby all the EOM data patterns EDP shown in FIG. 13 are provided from the host device 100 to the memory device 200, and the memory device 200 may perform the EOM operation for each of the EOM data patterns EDP.

The structure of the EOM data transmitted from the host device 100 to the memory device 200 is not limited to the example shown in FIG. 12.

FIG. 15 is a view illustrating the structure of the EOM data transmitted from the host device 100 to the memory device 200 according to another embodiment of the present disclosure.

Referring to FIG. 15, the EOM data may include an EOM data header EDH and an EOM data pattern EDP.

The EOM data header EDH may include parameters required for execution of the EOM operation.

For example, a timing offset field Timing Offset and a timing step field Timing Step may include at least one of the horizontal offset dX1 or the horizontal offset dX2, which will be transmitted to the memory device 200, and a voltage offset field Voltage Offset and a voltage step field Voltage Step may include at least one of the vertical offset dY1 or the vertical offset dY2, which will be transmitted to the memory device 200.

In the present embodiment, at least one of the horizontal offset dX1 or the horizontal offset dX2 and at least one of the vertical offset dY1 or the vertical offset dY2 are not represented by one value, as in the embodiment shown in FIG. 12, but represented by two fields of a reference value (reference phase or reference voltage) and an offset value (offset phase value or offset voltage value) for the reference value.

The number of sampling times that the memory device 200 executes while performing the EOM operation may be provided from the host device 100 to the memory device 200 through a number of sampling field Number of Sampling.

A size of the pattern data to be received by the memory device 200 from the host device 100 may be provided from the host device 100 to the memory device 200 through a data length field Total Data Length.

Referring back to FIG. 8, the memory device 200 that has performed the EOM operation transmits a response signal including the result of execution of the EOM operation to the host device 100 (S160).

At this time, the response signal may include information as to whether the EOM operation has been successfully performed, and an error count value corresponding to each of the horizontal offset and the vertical offset.

For example, when the number of sampling times of the number of sampling field NUMBER OF SAMPLING provided from the host device 100 to the memory device 200 is the same as the number of sampling count signals SC output from the comparator CP1 of the memory device 200, the memory device 200 may determine that the EOM operation is completed, and may transmit complete information to the host device 100.

On the contrary, when the number of sampling times of the number of sampling field NUMBER OF SAMPLING provided from the host device 100 to the memory device 200 is different from the number of sampling count signals SC output from the comparator CP1 of the memory device 200, the memory device 200 may determine that the EOM operation is not completed, and may transmit failure information to the host device 100.

In some embodiments, the information as to whether the EOM operation has been successfully performed may be provided to the host device 100 through, for example, a response field shown in FIG. 16, but the embodiments are not limited thereto.

Also, in some embodiments, the error count value described above may be provided to the host device 100 through four sense data fields Sense Data[0], Sense Data[1], Sense Data[2] and Sense Data[3] shown in FIG. 16, but the embodiments are not limited thereto.

In some embodiments, the response signal may include preset information. This preset information may be used to change signal driving characteristics of the host device 100 or to change signal receiving characteristics of the memory device 200 by reference.

In the memory system described above, there is no need for a separate external device to identify quality characteristics of signals transmitted and received between the host device 100 and the memory device 200. Furthermore, the signal line in which the EOM operation is performed is the same as the signal line in which the host device 100 and the memory device 200 transmit and receive signals. Therefore, a reliable EOM operation may easily be performed. In addition, as described above, different offset conditions may be applied at the same time to perform the EOM operation, whereby the EOM operation may be performed at a high speed.

Figure 17:
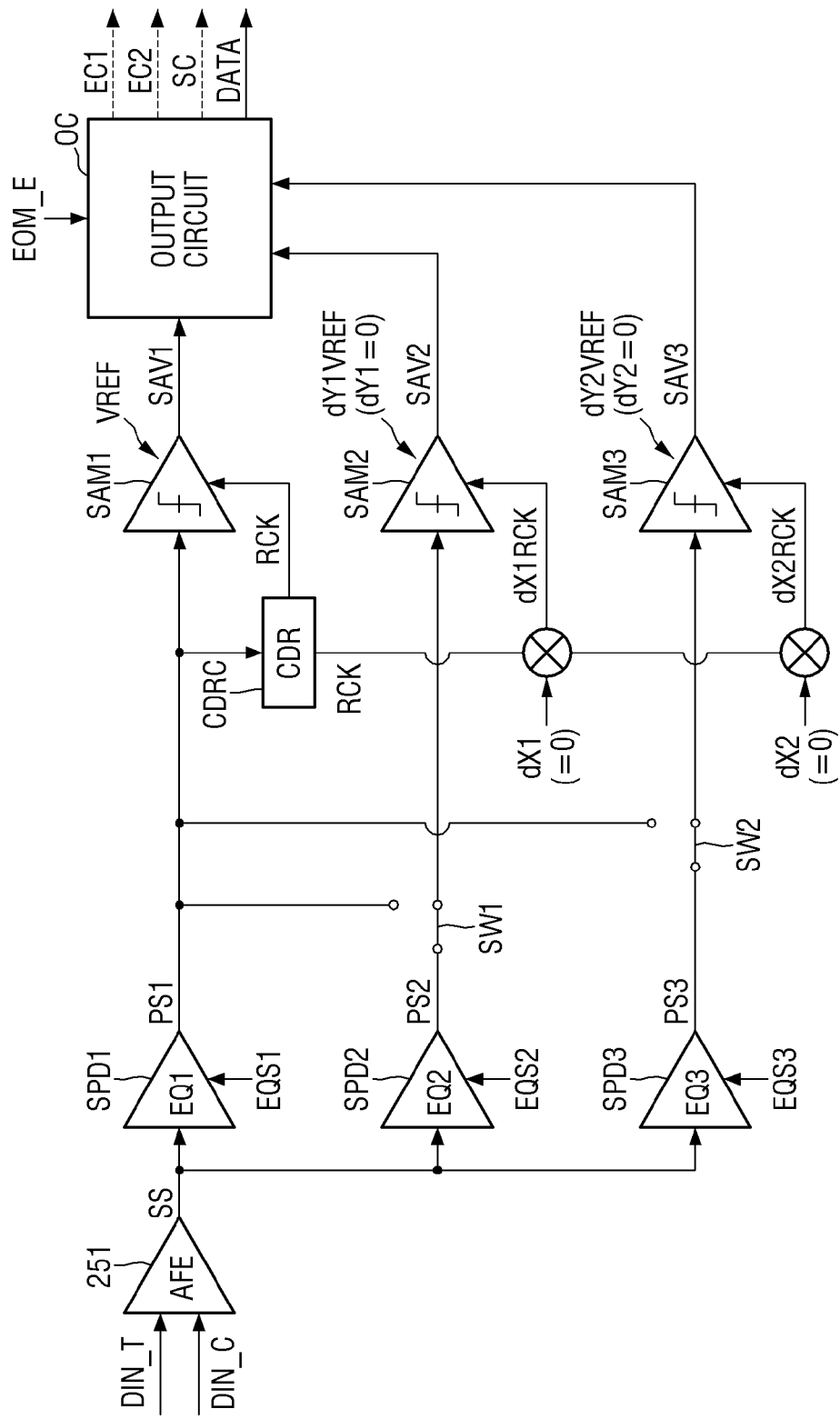
FIG. 17 is a view illustrating that a signal receiving device of a memory device operates in an EOM disable mode, according to example embodiments.

FIG. 17 is a view illustrating that a signal receiving device of a memory device operates in an EOM disable mode, according to example embodiments.

In a state that the command requesting execution of the EOM operation is not received from the host device 100, the signal receiving device of the memory device 200 operates in an EOM disable mode. For example, the UFS device controller 210 may apply a control signal EOM_E of a logic low level to the CDR block 253 to command the CDR block 253 to disable the EOM.

Therefore, as shown in FIG. 17, the switch SW1 connects the signal processing device SPD2 to the sampler SAM2 to provide the processed signal PS2, which is the output of the signal processing device SPD2, to the sampler SAM2. Further, the switch SW2 connects the signal processing device SPD3 to the sampler SAM3 to provide the processed signal PS3, which is the output of the signal processing device SPD3, to the sampler SAM3.

Meanwhile, all of the horizontal offset dX1, the horizontal offset dX2, the vertical offset dY1 and the vertical offset dY2 have a value of 0. Therefore, both the offset clock signal dX1RCK and the offset clock signal dX2RCK are the same as the recovered clock signal RCK, and both the offset voltage dY1VREF and the offset voltage dY2VREF are the same as the reference voltage VREF.

Therefore, the equalizer EQ1 equalizes the serial signal SS with the set value EQS1 to output the processed signal PS1, and the sampler SAM1 samples the processed signal PS1 under the reference conditions XREF and VREF (FIG. 14) to output the sampling value SAV1. The equalizer EQ2 equalizes the serial signal SS with the set value EQS2 to output the processed signal PS2, and the sampler SAM2 samples the processed signal PS2 under the reference conditions XREF and VREF (FIG. 14) to output the sampling value SAV2. The equalizer EQ3 equalizes the serial signal SS with the set value EQS3 to output the processed signal PS3, and the sampler SAM3 samples the processed signal PS3 under the reference conditions XREF and VREF (FIG. 14) to output the sampling value SAV3.

Meanwhile, the voting circuit VC (FIG. 4) of the output circuit OC is enabled, and the EOM circuit EOMC (FIG. 4) is disabled. In this case, the output circuit OC may output the data DATA and may not output the error count signals EC1 and EC2 and the sampling count signal SC.

The voting circuit VC (FIG. 4) performs majority voting for the sampling values SAV1, SAV2 and SAV3 to determine output data DATA.

As listed in Table 1 below, the majority voting performed by the voting circuit VC (FIG. 4) determines results of the sampling values SAV1, SAV2 and SAV3, which have a large portion in number, as output data DATA.

TABLE 1

| SAV1 | SAV2 | SAV3 | Output data |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

For example, when the memory device 200 is mounted in an autonomous vehicle and real-time driving data is stored in the memory device 200, reliability of the data stored in the memory device 200 is very important. Therefore, in the present embodiment, when the signal receiving device of the memory device 200 operates in the EOM disable mode in which the EOM operation is not performed, the signal receiving device may verify the serial signal SS received from the host device 100 by using a lockstep technique, whereby analysis accuracy of the received signal may be enhanced.

Figure 18:
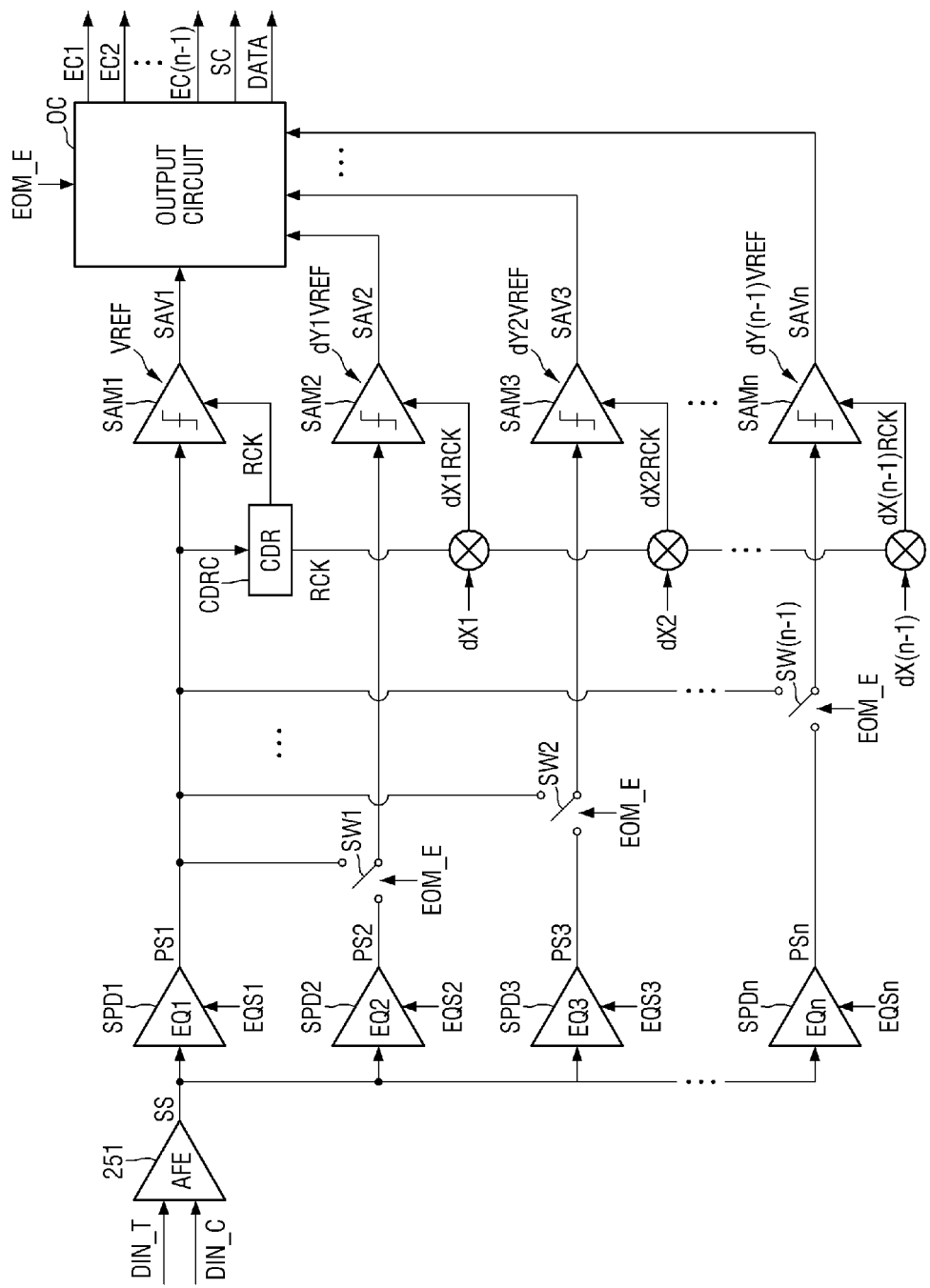
FIG. 18 is a view illustrating a signal receiving device of a memory device according to some other embodiments of the present disclosure.

FIG. 18 is a view illustrating a signal receiving device of a memory device according to some other embodiments of the present disclosure. Hereinafter, the same description as the above-described embodiments will be omitted, and the following description will be based on a difference from the above-described embodiments.

Referring to FIG. 18, a signal receiving circuit of the memory device may include n signal processing devices SPD1 to SPDn (n is a natural number of 4 or more), a clock recovery circuit CDRC, n samplers SAM1 to SAMn, (n−1) switches SW1 to SW(n−1), and an output circuit OC.

The output circuit OC may perform majority voting for the n sampling values SAV1 to SAVn in the EOM disable mode to output data. The output circuit OC may output (n−1) error count signals, one sampling count signal and data by using (n−1) comparators in the EOM enable mode.

In case of the present embodiment, since majority voting is performed for the n sampling values SAV1 to SAVn, reliability of data reception may be improved, and since the EOM may be performed for one serial signal SS (n−1) times, the EOM may be performed at a high speed.

Figure 19:
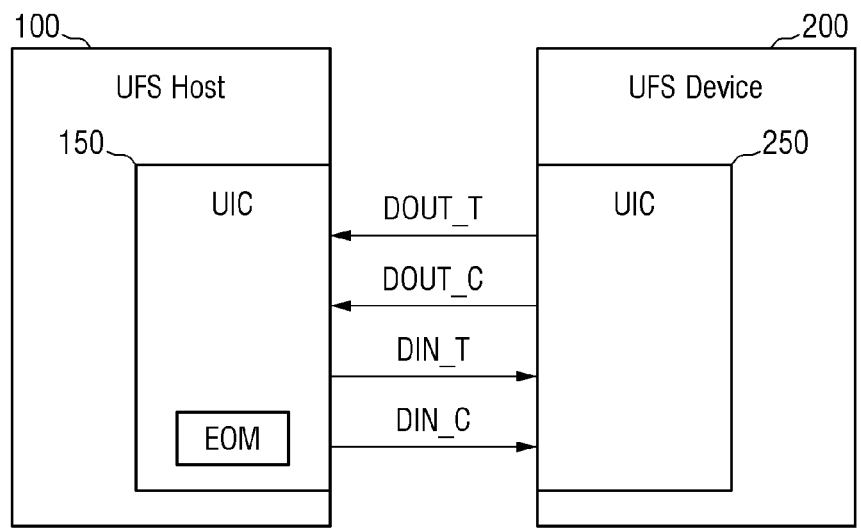
FIG. 19 is a view illustrating a memory system according to some other embodiments of the present disclosure.

FIG. 19 is a view illustrating a memory system according to some other embodiments of the present disclosure. The following description will be based on a difference from the above-described embodiments.

Referring to FIG. 19, in the present embodiment, the UIC layer 150 of the host device 100 performs the EOM operation and the plurality of voting operations, which are described above. For example, the UIC layer 150 of the host device 100 may include circuits, devices, or items the same as or similar to the circuits, devices, or items included in the UIC layer 250 disclosed above. Thus, the UIC layer 150 of the host device 100 may perform the EOM operation and the plurality of voting operations for the differential output signal pair DOUT_T and DOUT_C received from the memory device 200. In this case, the AFE 251 of the UIC layer 150 may receive the differential output signal pair DOUT_T and DOUT_C instead of the differential input signal pair DIN_T and DIN_C.

Figure 20:
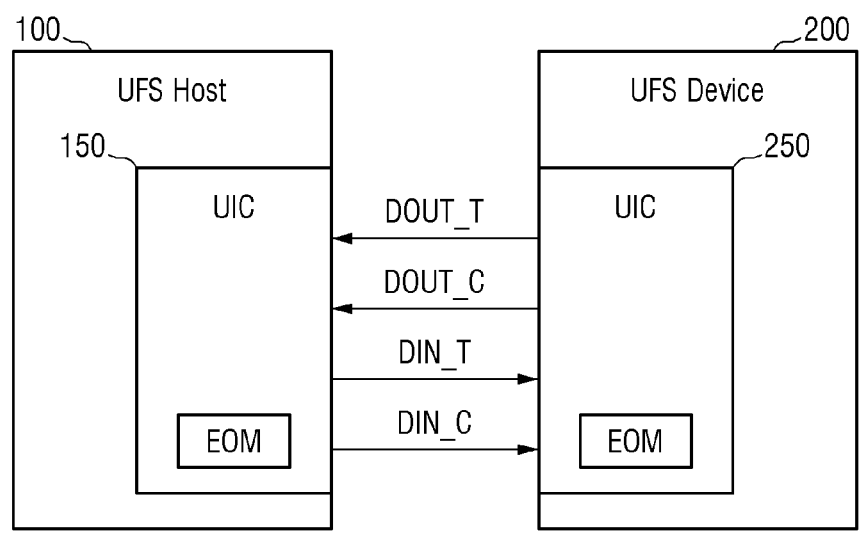
FIG. 20 is a view illustrating a memory system according to some other embodiments of the present disclosure.

FIG. 20 is a view illustrating a memory system according to some other embodiments of the present disclosure. The following description will be based on a difference from the above-described embodiments.

Referring to FIG. 20, in the present embodiment, both the UIC layer 150 of the host device 100 and the UIC layer 250 of the memory device 200 perform the EOM operation and the plurality of voting operations, which are described above.

Figure 21:
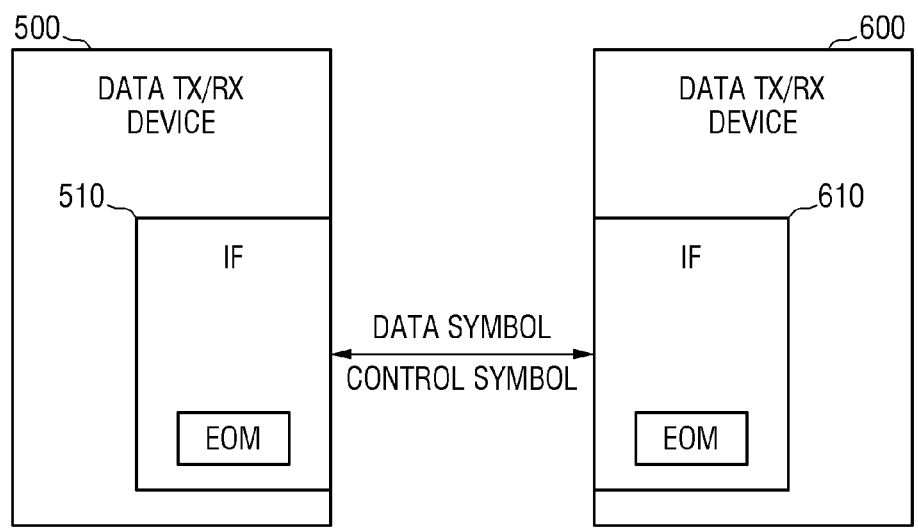
FIG. 21 is a view illustrating a data transmission and reception system according to some other embodiments of the present disclosure.

FIG. 21 is a view illustrating a data transmission and reception system according to some other embodiments of the present disclosure.

Referring to FIG. 21, the data transmission and reception system may include a first data transceiver 500 including a first interface 510, and a second data transceiver 600 including a second interface 610.

The first interface 510 and the second interface 610 may perform the EOM operation and the plurality of voting operations, which are described above.

In some embodiments, the first data transceiver 500 may be a camera module, and the second data transceiver 600 may be an application processor. Also, in some embodiments, the first data transceiver 500 may be a display driver IC, and the second data transceiver 600 may be a display panel. In addition, the first data transceiver 500 and the second data transceiver 600 may be carried by being modified to various electronic devices that are not illustrated.

Figure 22:
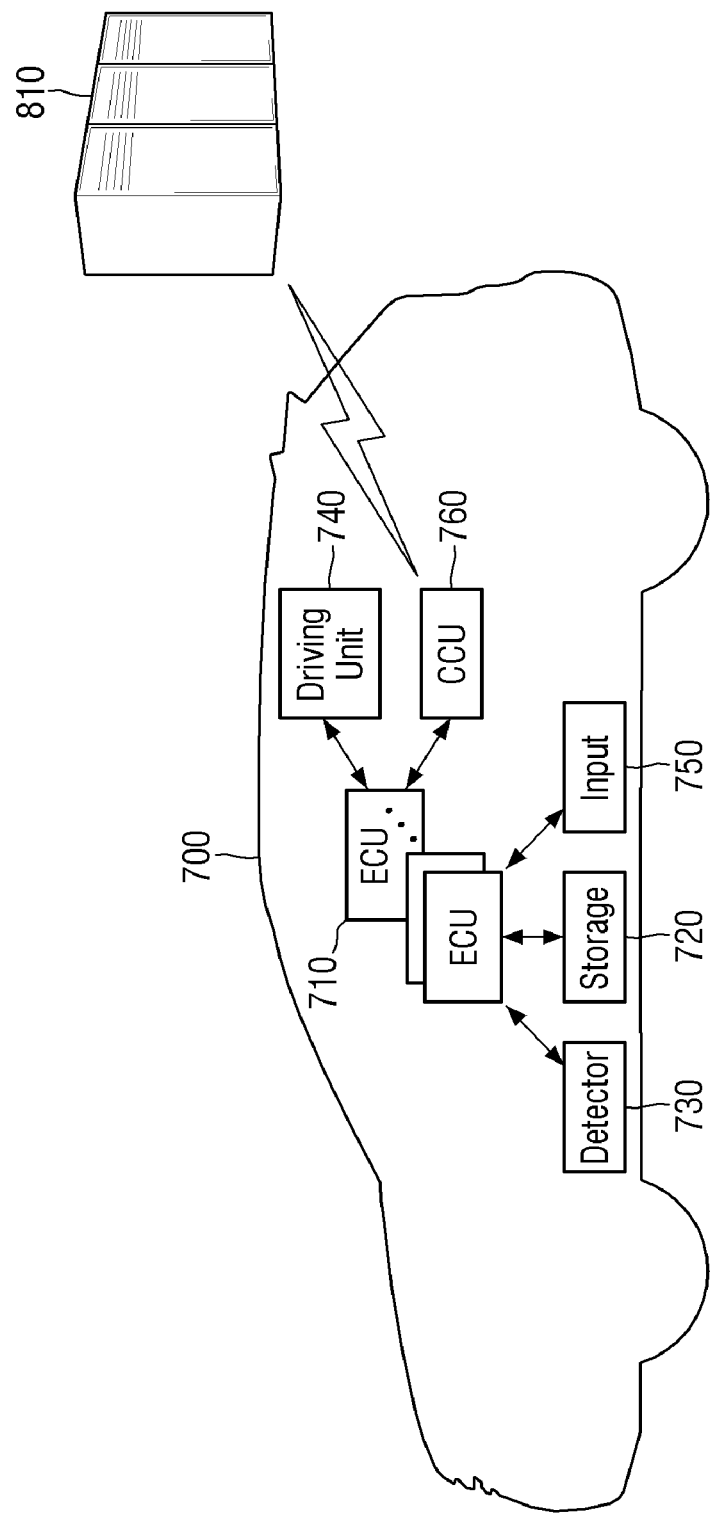
FIG. 22 is a view illustrating a vehicle with a memory system according to some embodiments of the present disclosure.

FIG. 22 is a view illustrating a vehicle with a memory system according to some embodiments of the present disclosure.

The vehicle 700 may include a plurality of electronic control units ECU 710 and a storage unit 720.

Each of the plurality of electronic control units 710 is electrically, mechanically and communicatively connected to at least one of a plurality of devices provided in the vehicle 700, and may control an operation of at least one device based on any one function execution command.

In this case, the plurality of devices may include an acquisition device 730 for acquiring information required for execution of at least one function and a driving unit 740 for performing at least one function.

For example, the acquisition device 730 may include various detection units and image acquisition units, and the driving unit 740 may include a fan and a compressor of an air conditioner, a fan of a ventilation device, an engine and a motor of a power device, a motor of a steering device, a motor and a valve of a braking device, a switching device of a door or a tail gate, and the like.

The plurality of electronic control units 710 may perform communication with the acquisition device 730 and the driving unit 740 using at least one of Ethernet, low voltage differential signal (LVDS) communication, or Local Interconnect Network (LIN) communication.

The plurality of electronic control units 710 may determine whether to need to execute a function based on the information acquired through the acquisition device 730, and when it is determined that execution of the function is required, may control the operation of the driving unit 740 for performing the corresponding function and control the operation amount based on the acquired information. At this time, the plurality of electronic control units 710 may store the acquired information in the storage unit 720 or read and use the information stored in the storage unit 720. In some embodiments, the plurality of electronic control units 710 may correspond to the host device 100 (FIG. 1) described above, and the storage unit 720 may correspond to the memory device 200 (FIG. 1) described above.

The plurality of electronic control units 710 may control the operation of the driving unit 740, which performs the corresponding function, based on the function execution command input through an input unit 750, and may check the amount of setup corresponding to the information input through the input unit 750 and control the operation of the driving unit 740, which performs the corresponding function, based on the checked amount of setup.

Each electronic control unit 710 may independently control any one function, or may be associated with another electronic control device to control any one function.

For example, when a distance from an obstacle detected through a distance detector is within a reference distance, an electronic control device of a collision avoidance system may output a warning sound for the collision with the obstacle through a speaker.

An electronic control unit of an autonomous driving control system may be associated with an electronic control unit of a vehicle terminal, an electronic control unit of an image acquisition unit, and an electronic control device of the collision avoidance system to receive navigation information, road image information and distance information from the obstacle and control the power device, the braking device and the steering device using the received information, thereby performing autonomous driving.

A connectivity control unit (CCU) 760 is electrically, mechanically, communicatively connected with each of the electronic control units 710, and performs communication with each of the electronic control units 710.

For example, the connectivity control unit 760 may directly perform communication with the electronic control units 710 provided inside the vehicle, may perform communication with an external server, and may perform communication with an external terminal through an interface.

The connectivity control unit 760 may perform communication with the electronic control units 710, and may perform communication with a server 810 through an antenna (not shown) and RF communication.

In addition, the connectivity control unit 760 may perform communication with the server 810 through wireless communication. In this case, the wireless communication between the connectivity control unit 760 and the server 810 is possible through various wireless communication modes such as Global System for Mobile Communication (GSM), Code Division Multiple Access (CDMA), Wideband Code Division Multiple Access (WCDMA), Universal Mobile Telecommunications System (UMTS), Time Division Multiple Access (TDMA) system and Long Term Evolution (LTE) system, in addition to a Wi-Fi module and a wireless broadband (WiBro) module.

In concluding the detailed description, those skilled in the art will appreciate that many variations and modifications may be made to the preferred embodiments without substantially departing from the principles of the present invention. Accordingly, all such modifications are intended to be included within the scope of the present disclosure as defined in the claims.

What is claimed is:

1. A signal receiving device comprising:
    a sampling device configured to sample an input signal to output a plurality of sampling values; and
    an output circuit configured to output data based on the plurality of sampling values,
    wherein the output circuit is configured to:
    output the data by performing majority voting based on first to third sampling values of the plurality of sampling values in response to a first control signal, and
    output the data and first and second error count signals based on the first sampling value and fourth and fifth sampling values of the plurality of sampling values in response to a second control signal,
    wherein the first error count signal is generated by comparing the first sampling value sampled under a reference condition with the fourth sampling value sampled under a first offset condition, and
    wherein the second error count signal is generated by comparing the first sampling value with the fifth sampling value sampled under a second offset condition different from the first offset condition.

2. The signal receiving device of claim 1, wherein the sampling device includes:
    a first sampler configured to extract the first sampling value from a first signal based on the reference condition;
    a second sampler configured to:
    in response to the first control signal, extract the second sampling value from a second signal based on the first offset condition, and
    in response to the second control signal, extract the fourth sampling value from the first signal based on the first offset condition; and
    a third sampler configured to:
    in response to the first control signal, extract the third sampling value from a third signal based on the second offset condition, and
    in response to the second control signal, extract the fifth sampling value from the first signal based on the second offset condition,
    wherein the reference condition includes a clock signal and a reference voltage,
    wherein the first offset condition includes a first offset clock signal in which a first horizontal offset is applied to the clock signal and a first offset voltage in which a first vertical offset is applied to the reference voltage, and
    wherein the second offset condition includes a second offset clock signal in which a second horizontal offset is applied to the clock signal and a second offset voltage in which a second vertical offset is applied to the reference voltage.

3. The signal receiving device of claim 2, wherein the sampling device further includes:
    a first equalizer configured to set to a first set value, and output the first signal to the first sampler;
    a second equalizer configured to:
    set to a second set value different from the first set value, and
    output the second signal to the second sampler in response to the first control signal; and
    a third equalizer configured to:
    set to a third set value different from the first and second set values, and
    output the third signal to the third sampler in response to the first control signal.

4. The signal receiving device of claim 3, wherein the sampling device further includes:
a clock recovery circuit configured to recover a clock signal from the first signal and provide the recovered clock signal to the first sampler.

5. The signal receiving device of claim 2, wherein the sampling device further includes:
a first equalizer configured to set to a first set value, and provide the first signal to the first sampler;
a second equalizer configured to set to a second set value different from the first set value;
a third equalizer configured to set to a third set value different from the first and second setting values;
a first switch configured to connect the second equalizer to the second sampler in response to the first control signal, and connect the first equalizer to the second sampler in response to the second control signal; and
a second switch configured to connect the third equalizer to the third sampler in response to the first control signal, and connect the first equalizer to the third sampler in response to the second control signal.

6. The signal receiving device of claim 2, wherein, in response to the first control signal:
the first offset clock signal provided to the second sampler is the same as the clock signal and the first offset voltage provided to the second sampler is the same as the reference voltage, and
the second offset clock signal provided to the third sampler is the same as the clock signal and the second offset voltage provided to the third sampler is the same as the reference voltage.

7. The signal receiving device of claim 2, wherein, in response to the second control signal:
when the first horizontal offset is 'a,' 'a' being a real number, the second horizontal offset is '−a', and
when the first vertical offset is 'b,' 'b' being a real number, the second vertical offset is '−b'.

8. The signal receiving device of claim 1, wherein the signal receiving device is configured not to perform an eye open monitor (EOM) operation in response to the first control signal, and
wherein the signal receiving device is configured to perform the EOM operation in response to the second control signal.

9. The signal receiving device of claim 1, wherein the output circuit includes:
a voting circuit configured to output the data by performing majority voting for the first to third sampling values in response to the first control signal; and
an eye open monitor (EOM) circuit configured to output the first and second error count signals and the data based on the first, fourth, and fifth sampling values, and
wherein the EOM circuit includes:
a first comparator configured to generate the first error count signal by comparing the first sampling value with the fourth sampling value; and
a second comparator configured to generate the second error count signal by comparing the first sampling value with the fifth sampling value.

10. The signal receiving device of claim 9, wherein the first comparator is configured to output a sampling count signal.

11. The signal receiving device of claim 1, wherein the input signal is a serialized signal.

12. A signal receiving device comprising:
a first signal processing device configure to perform a first processing on an input signal to generate a first processed signal;
a second signal processing device configured to perform a second processing different from the first processing on the input signal to generate a second processed signal;
a third signal processing device configured to perform a third processing different from the first processing and the second processing on the input signal to generate a third processed signal;
a clock recovery circuit configured to recover a clock signal from the first processed signal to generate a recovered clock signal;
a first sampler configured to extract a first sampling value from the first processed signal based on the recovered clock signal and a reference voltage;
a second sampler configured to extract a second sampling value from the second processed signal based on a first offset clock signal in which a first horizontal offset is applied to the recovered clock signal and a first offset voltage in which a first vertical offset is applied to the reference voltage;
a third sampler configured to extract a third sampling value from the third processed signal based on a second offset clock signal in which a second horizontal offset is applied to the recovered clock signal and a second offset voltage in which a second vertical offset is applied to the reference voltage; and
an output circuit configured to output data by performing majority voting based on the first to third sampling values.

13. The signal receiving device of claim 12, wherein:
the first signal processing device includes a first equalizer configured to set to a first set value,
the second signal processing device includes a second equalizer configured to set to a second set value different from the first set value, and
the third signal processing device includes a third equalizer configured to set to a third set value different from the first and second set values.

14. The signal receiving device of claim 12, wherein:
each of the first and second offset clock signal is the same as the recovered clock signal, and
each of the first and second offset voltages is the same as the reference voltage.

15. The signal receiving device of claim 12, wherein the input signal includes serial signals provided as a differential input signal pair.

16. A signal receiving device comprising:
a clock recovery circuit configured to recover a clock signal from an input signal to generate a recovered clock signal;
a first sampler configured to extract a first sampling value from the input signal based on the recovered clock signal and a reference voltage;
a second sampler configured to extract a second sampling value from the input signal based on a first offset clock signal in which a first horizontal offset is applied to the recovered clock signal and a first offset voltage in which a first vertical offset is applied to the reference voltage;
a third sampler configured to extract a third sampling value from the input signal based on a second offset clock signal in which a second horizontal offset is applied to the recovered clock signal and a second offset voltage in which a second vertical offset is applied to the reference voltage; and an output circuit configured to output a first error count signal by comparing the first sampling value with the second sampling value and output a second error count signal by comparing the first sampling value with the third sampling value.

17. The signal receiving device of claim 16, wherein, when the first horizontal offset is 'a,' 'a' being a real number, the second horizontal offset is '−a', and wherein, when the first vertical offset is 'b,' 'b' being real number, the second vertical offset is '−b'.

18. The signal receiving device of claim 16, wherein the output circuit includes an eye open monitor (EOM) circuit configured to output the first and second error count signals and data based on the first to third sampling values, and wherein the EOM circuit includes:
  a first comparator configured to generate the first error count signal by comparing the first sampling value with the second sampling value; and
  a second comparator configured to generate the second error count signal by comparing the first sampling value with the third sampling value.

19. The signal receiving device of claim 18, wherein the first comparator is configured to output a sampling count signal.

20. The signal receiving device of claim 16, further comprising:

an equalizer configured to equalize the input signal, and provide the equalized input signal to the first to third samplers.

* * * * *